United States Patent [19]
Watanabe et al.

[11] Patent Number: 5,776,659
[45] Date of Patent: Jul. 7, 1998

[54] IONIZING RADIATION EXPOSURE METHOD UTILIZING WATER SOLUBLE ANILINE ANTISTATIC POLYMER LAYER

[75] Inventors: Keiji Watanabe; Ei Yano; Takahisa Namiki; Keiko Yano; Takashi Maruyama, all of Kawasaki; Tomio Nakamura, Tokyo; Shigeru Shimizu, Tokyo; Takashi Saitoh, Tokyo; Masashi Uzawa, Tokyo; Masami Ishikawa, Tokyo, all of Japan

[73] Assignees: Fujitsu Limited, Kawasaki; Nitto Chemical Industry Co., Ltd., Tokyo, both of Japan

[21] Appl. No.: 762,877

[22] Filed: Dec. 12, 1996

Related U.S. Application Data

[63] Continuation of Ser. No. 542,193, Oct. 12, 1995, abandoned.

[30] Foreign Application Priority Data

Oct. 12, 1994 [JP] Japan ................... 6-246511

[51] Int. Cl.$^6$ ............................................. G03F 7/30
[52] U.S. Cl. ........................... 430/296; 430/311; 430/527; 430/528; 430/529; 430/942
[58] Field of Search ................... 430/253, 258, 430/311, 527, 528, 529, 296, 942

[56] References Cited

FOREIGN PATENT DOCUMENTS

| | | |
|---|---|---|
| A-64-37015 | 2/1989 | Japan. |
| A-3-87743 | 4/1991 | Japan. |
| A-3-226926 | 10/1991 | Japan. |
| A-4-32848 | 2/1992 | Japan. |
| A-4-349614 | 12/1992 | Japan. |
| A-5-178989 | 7/1993 | Japan. |
| A-5-226238 | 9/1993 | Japan. |
| A-5-324237 | 12/1993 | Japan. |
| A-6-3813 | 1/1994 | Japan. |
| A-6-56987 | 3/1994 | Japan. |

OTHER PUBLICATIONS

J. Yue, *J. Am. Soc.* 1990, 112; 2800–2801; "Synthesis of Self–Doping Conducting Polyaniline".
J. Yue, et al., *J. Am. Chem. Soc.* 1991, 113; 2665–2671; "Effect of Sulfonic Acid Group on Polyaniline Backbone".
T. Kitakohji et al., *J. Electrochem. Soc: Electrochem. Sci. & Tech.*, Nov. 1979; 1881–4; "Polymers Constituted by Methyl Methacrylate . . . ".

*Primary Examiner*—Christopher G. Young
*Attorney, Agent, or Firm*—Armstrong, Westerman, Hattori, McLeland & Naughton

[57] ABSTRACT

A composition for irradiation with an ionizing radiation, characterized by comprising: (a) 0.01 to 30 parts by weight of a soluble aniline polymer which comprises one or both of the repeating units represented by the following general formulae (1) and (2), said repeating units being included at least 80% of the total repeating units, possesses a weight average molecular weight of not less than 10,000, and is solid at room temperature; and (b) 100 parts by weight of a solvent.

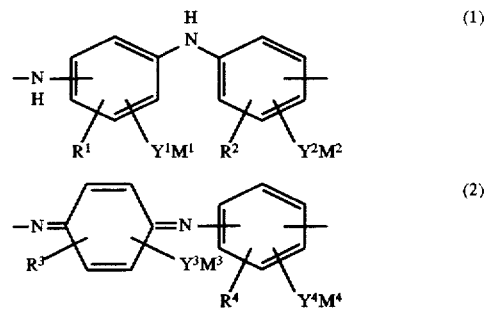

wherein $R^1$ to $R^4$ represent an electron-donating group, $Y^1$ to $Y^4$ represent —$SO_3$— or —COO—, and $M^1$ to $M^4$ represent a hydrogen ion, an ammonium ion, an alkyl ammonium ion with 1 to 8 carbon atoms, an aromatic ammonium ion, or a quaternary ion of an aromatic heterocyclic ring.

8 Claims, 18 Drawing Sheets

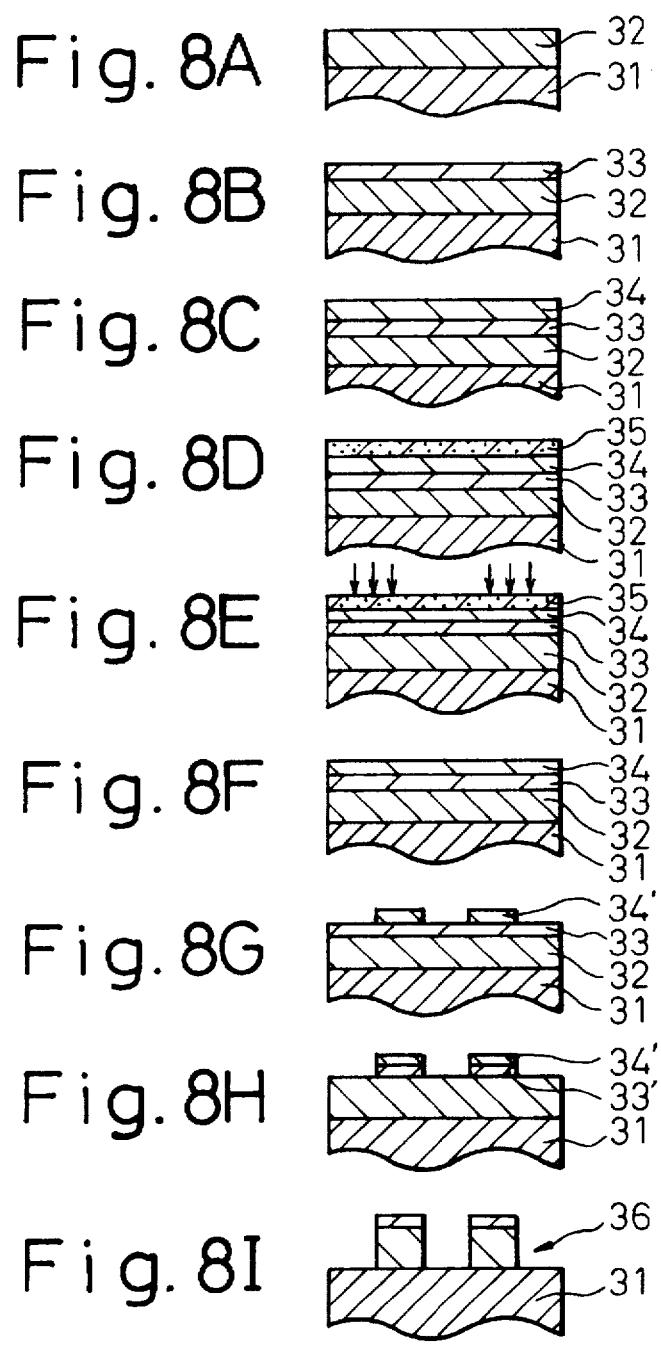

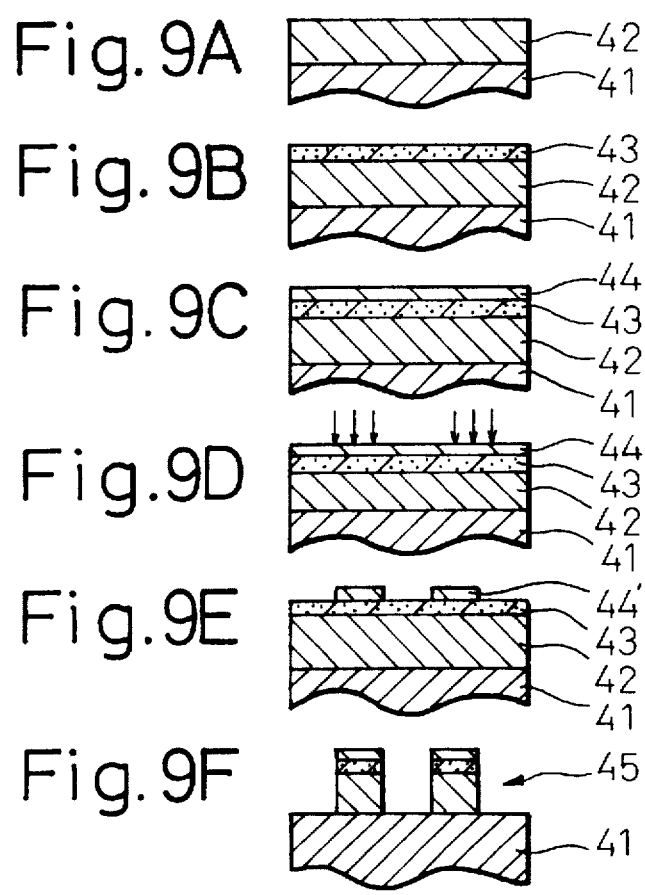

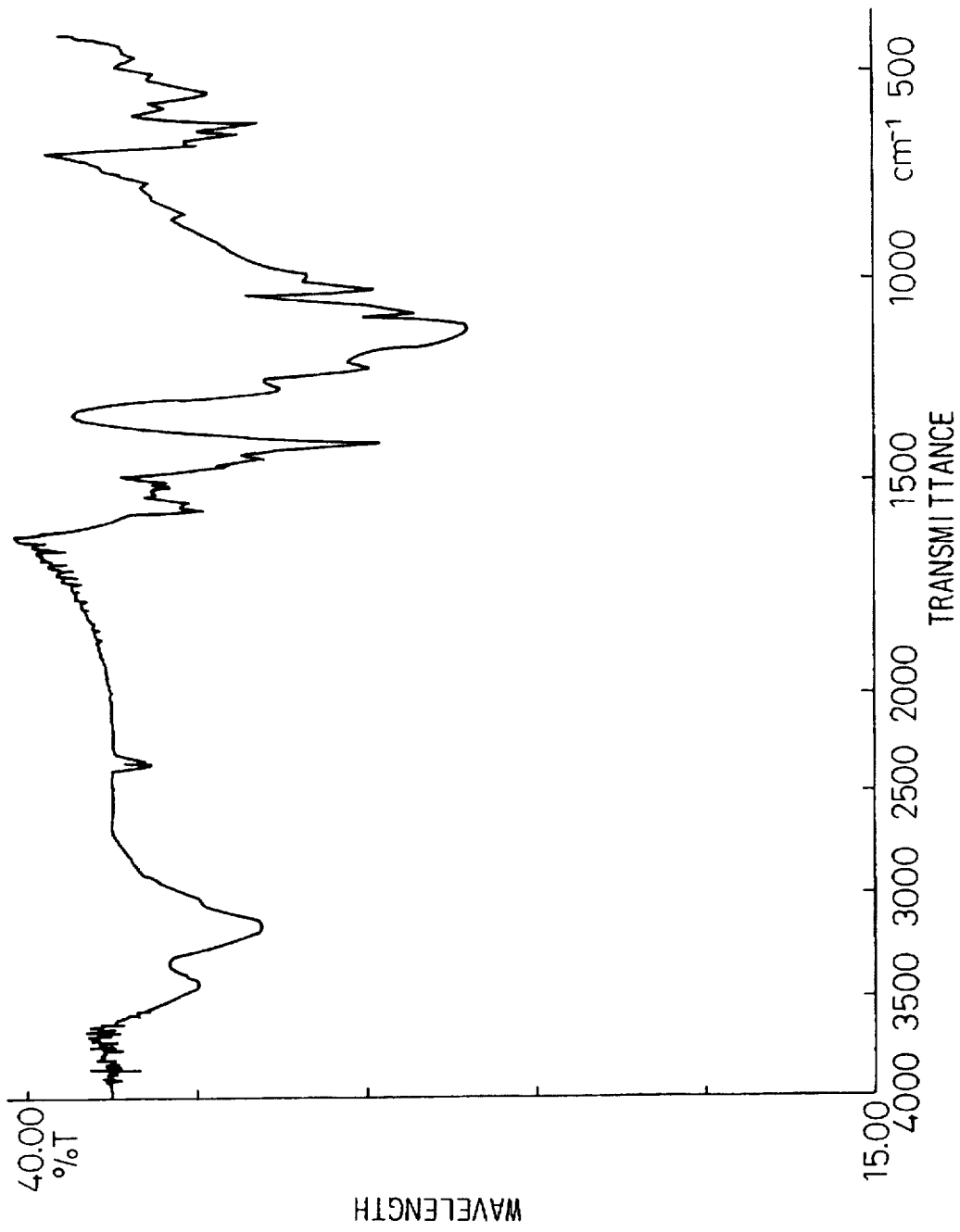

IONIZING RADIATION EXPOSURE METHOD UTILIZING WATER SOLUBLE ANILINE ANTISTATIC POLYMER LAYER

This application is a continuation of application Ser. No. 08/542,193 filed Oct. 12, 1995, now abandoned.

BACKGROUND OF THE INVENTION

1. Field of the Invention

The present invention relates to a composition, for irradiation with an ionizing radiation, such as an electron beam or an ion beam, and an ionizing radiation irradiation method using the same and more particularly to a method for forming a pattern, an ion implantation method, and a method for observing or measuring a sample.

2. Description of the Related Art

Thin film formation and photographic etching are mainly used for the formation of electronic circuit devices having fine patterns, such as semiconductor devices. Specifically, thin films, such as a conductive layer and an insulating layer, are formed on a substrate by sputtering, chemical vapor deposition or the like, a resist (a photosensitive resin) is coated thereon by spin coating or the like, the coating is selectively exposed, and a pattern is then formed by taking advantage of a difference in developed properties, for example, a difference in solubility in a developing solution, between unexposed areas and exposed areas. The resist pattern is used as a mask to conduct wet etching or dry etching, thereby forming a fine conductor pattern or an insulator pattern on a substrate.

Ultraviolet light, excimer laser light, X-rays, an electron beam, a focused ion beam and the like are used as light source for exposure of a resist. Among them, electron beam lithography has been extensively utilized for the preparation of photomasks, the preparation of a logical circuit on an experimental basis and the production in a small quantity of various LSIs such as ASICs for which there is an ever-increase need in recent years because a pattern can be directly drawn on a resist by electron beam scanning. Further, focused ion beams, which also allow a pattern to be directly drawn, are less likely to scatter within a resist, resulting in direct advance property, and, at the same time, can provide high resolution. For this reason, the application of the focused ion beams to special devices requiring fine fabrication has been studied in the art.

Since, however, the resist for an electron beam or a focused ion beam is generally formed of an insulator, exposure using the electron beam or the focused ion beam causes the accumulation of charges, that is, a charge-up phenomenon, resulting in misregistration of a resist pattern. The misregistration increases with an increased fineness of the pattern, posing a serious problem associated with an increase in integration. Further, in the production of semiconductors, since ion implantation is carried out through an insulation film, for example, an oxide film or a resist, ionic charges cause a charge-up phenomenon. The charge-up phenomenon leads to uneven ion distribution, deteriorated control of ion implantation, and breakdown of the substrate. This influences the properties of devices, resulting in reduced reliability.

Regarding techniques for preventing the charge up phenomenon, several proposals have been made up to now.

For example, an attempt has been made to prevent the charge-up phenomenon by covering or coating a resist, for the formation of a pattern, with aluminum (Japanese Unexamined Patent Publication (Kokai) No. 3-226926) or ammonium polystyrenesulfonate (Japanese Unexamined Patent Publication (Kokai) No. 64-37015). However, the method wherein the resist is covered with aluminum involves a complicated process. On the other hand, the method using ammonium polystyrenesulfonate is unsatisfactory in the effect of preventing the charge-up phenomenon although the process is simple.

A further method for preventing the charge-up phenomenon has been proposed wherein a conductive polymer having a sulfone group is coated on a substrate to prevent the charge-up phenomenon during charged particle beam irradiation (Japanese Unexamined Patent Publication (Kokai) No. 4-32848). This method, however, involves the following problems: (i) Since the solution and the film are strongly acidic, the formation of a pattern using them adversely affects the resist, elements, wiring materials, distributing heads and the like; (ii) Since the conductivity is unsatisfactory, the effect of preventing the charge-up phenomenon is unsatisfactory; and (iii) Unsatisfactory solubility poses problems such as lowered resolution and occurrence of a residue after peeling. These problems render the above method unsatisfactory for practical use.

Compounds comprising repeating units represented by the formula (III') described in Japanese Unexamined Patent Publication (Kokai) No. 4-32848 are most relevant to the polymer used in the present invention:

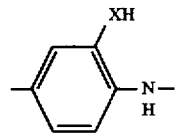

wherein X represents $SO_3$. According to the process (J. Am. Chem. Soc., 1990, 112, 2800) referred to in Japanese Unexamined Patent Publication (Kokai) No. 4-32848, it is difficult to prepare a polymer with a sulfone group introduced into all aromatic groups. The content of the sulfone group in the resultant polymer based on the aromatic ring is about 50%, which provides levels of conductivity and solubility which are both unsatisfactory from the practical point of view.

The use of an aminobenzenesulfonic acid compound as a monomer is considered as useful for introducing a sulfone group into all aromatic rings contained in the repeating units. However, it is generally recognized by those skilled in the art that the reactivity of the aminobenzenesulfonic acid compound is so low that it is difficult to polymerize the monomer when used alone (J. Am. Chem. Soc., 1991, 113, 2665). For this reason, only two methods relating to the above technique have been proposed up to now. One of them is a method wherein, after chemical oxidation polymerization, the reaction mixture is evaporated to dryness to prepare a polymer (Japanese Unexamined Patent Publication (Kokai) No. 6-56987), and the other is a method wherein a polymer is prepared by electrolytic polymerization (The 64th National Meeting of the Chemical Society of Japan, 1992, 706). These methods, however, involve troublesome operations, rendering them unsuitable for industrial use. In addition, the effect of preventing the charge-up phenomenon is unsatisfactory due to low conductivity.

A method for preventing a charge-up phenomenon has also been proposed wherein a soluble conductive polymer, which has been rendered soluble in water, with hydroxyl, methoxy, and carboxyl groups introduced into aromatic rings of the conductive polymer is used (Japanese Unexamined Patent Publication (Kokai) No. 5-226238). However, it should be noted that, since the substituents introduced into the aromatic rings are hydroxyl, methoxy, and carboxyl groups, the conductivity and the solubility of the polymer are so low that the effect of preventing the charge-up phenomenon is unsatisfactory and, at the same time, the resolution is greatly influenced.

Under these circumstances, the present inventors have proposed a pattern formation method using a TCNCQ complex as a conductive component (Japanese Unexamined Patent Publication (Kokai) No. 3-87743). This method is simple and offers a satisfactory effect. Since, however, a ketone or ether organic solvent is used as the solvent, the use of a resist soluble in these solvents often results in the formation of a layer of a mixture of the organic solvent with the resist, deteriorating the properties of the resist.

Further, in order to solve these problems, the present inventors have proposed, in Japanese Unexamined Patent Publication (Kokai) Nos. 4-349614 and 6-003813 and Japanese Patent Application No. 5-324237, methods for preventing a charge-up phenomenon, which comprise coating a substrate with a composition composed mainly of a conductive aniline polymer, having a sulfone group, synthesized by a method which comprises copolymerizing at least one compound selected from the group consisting of aniline, N-alkylaniline and a phenylenediamine compound with an aminobenzenesulfonic acid and sulfonating the copolymer (Japanese Unexamined Patent Publication (Kokai) No. 5-178989) or a method which comprises copolymerizing at least one compound selected from the group consisting of aniline, N-alkylaniline, and a phenylenediamine compound with aminoanisolesulfonic acid (Japanese Patent Application No. 5-48540). In these methods, the composition can be coated on any resist, and peeling can be carried out simultaneously with the development of the resist. Therefore, the process is very simple, and, in addition, the effect of preventing the charge-up phenomenon is satisfactory. Further, the application of the above methods to a chemical amplification resist results in the effect of stabilizing the sensitivity against post exposure delay which is a period between exposure and baking after the exposure.

However, a further improvement in the effect of preventing the charge-up phenomenon is desired. Further, since the compositions used in a solution form in the above methods contain a base component and, hence, are weakly alkaline, the application to some chemical amplification resists causes a problem of a change of sensitivity.

Furthermore, it is difficult to peel the film using pure water.

The present invention has been made with a view to solving the above various problems, and an object of the present invention is to provide a composition for irradiation with an ionizing radiation and an ionizing radiation irradiation method, which is simple in process and versatile and excellent in the effect of preventing the charge-up phenomenon and, in addition, has the effect of stabilizing the sensitivity against the post exposure delay (PED) which is a period between exposure and baking after the exposure.

DESCRIPTION OF THE INVENTION

According to the present invention, the above object can be attained by a composition for irradiation with an ionizing radiation, characterized by comprising: (a) 0.01 to 30 parts by weight of a soluble aniline polymer which comprises one or both of the repeating units represented by the following general formulae (1) and (2), possesses a weight average molecular weight of not less than 10,000, and is solid at room temperature; and (b) 100 parts by weight of a solvent.

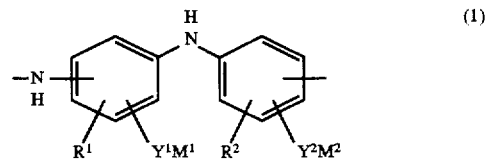

(1)

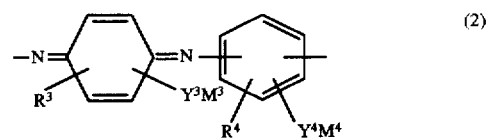

(2)

wherein $R^1$ to $R^4$ represent an electron-donating group, $Y^1$ to $Y^4$ represent —$SO_3$— or —COO—, and $M^1$ to $M^4$ represent a hydrogen ion, an ammonium ion, an alkyl ammonium ion with 1 to 8 carbon atoms, an aromatic ammonium ion, or a quaternary ion of an aromatic heterocyclic ring, and a method which comprises coating a composition, for irradiation with an ionizing radiation, on a substrate and irradiating the coating with an ionizing radiation.

The soluble aniline polymer as the component (a), comprising repeating units represented by the general formulae (1) and (2), constituting the composition of the present invention is preferably one synthesized by polymerizing an aniline derivative having, on the same aromatic ring, an electron-donating group and an acidic group, such as a sulfone group or a carboxyl group, using an oxidizing agent in a solvent containing a basic compound (Japanese Patent Application Nos. 5-353698 and 6-183882).

In this method, chemical polymerization of an aminobenzenesulfonic acid compound which had been recognized to be difficult to proceed can now proceed. Further, when an aniline derivative with an electrondonating group and an acidic group (such as a sulfone group or a carboxyl group) introduced on the same aromatic ring is used as the monomer, the reactivity is significantly improved, enabling an aniline polymer having a high molecular weight and possessing high conductivity to be easily prepared. Further, the resultant polymer, as compared with the conventional aniline polymer, has much higher solubility and is soluble in aqueous solutions having any pH on the acid or alkali side of neutrity, not to mention pure water. The application of the above aniline polymer to an ionizing radiation irradiation method, particularly a pattern formation method, is advantageous in that the effect of preventing a charge-up phenomenon and the effect of stabilizing the sensitivity against post exposure delay, which is a period between exposure and baking after the exposure, are excellent and, at the same time, the sensitivity and the resolution of the resist are not substantially influenced.

Aniline homopolymers comprising repeating units represented by the general formulae (1) and (2) are considered to have a structure represented by the following general formula (3)

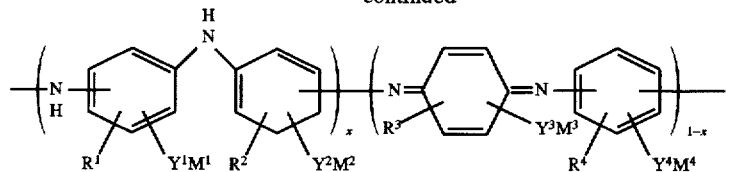

wherein x is any number of 0 to 1. The aniline polymer as the component (a) of the present invention includes, in addition to these homopolymers, copolymers which partially have this repeating unit, i.e., have a content of the above repeating unit of preferably at least 80%, still preferably not less than 90%, further preferably not less than 95%. A preferred aniline polymer is a homopolymer of the repeating unit (1) or (2).

Monomers for the copolymers include anilines, thiophenes, and pyrroles. Among them, anilines and/or aminobenzenesulfonic acids are preferred. Specific examples of the anilines include aniline; alkylanilines such as 2-methylaniline, 3-methylaniline, and 3-ethylaniline; alkoxyanilines such as 2-methoxyaniline, 3-methoxyaniline, and 2-ethoxyaniline; and N-alkylanilines such as N-methylaniline and N-ethylaniline. Examples of the aminobenzene sulfonic acids include 2-aminobenzenesulfonic acid and 3-aminobenzenesulfonic acid.

It is also possible to use a monomer having a conjugation along the main chain. The weight average molecular weight of the soluble aniline polymer as the component (a) is not less than 10,000, preferably 20,000 to 1,000,000, still more preferably 50,000 to 500,000. When it is less than 10,000, a pinhole is likely to occur in the preparation of a thin film from the polymer, while when it is excessively high, the polymer gels, rendering the polymer difficult to handle. $Y^1$ to $Y^4$ in the general formulae (1) and (2) of the component (a) may be any of a sulfone group ($SO_3$) and a carboxyl group (COO) with the sulfone group being preferred because it is excellent in the effect of preventing a charge-up phenomenon and the effect of stabilizing PED. $R^1$ to $R^4$ as the electron-donating group are preferably an alkoxy group (particularly with 1 to 8 carbon atoms), an alkenyl group (particularly with 1 to 8 carbon atoms), an alkyl group (particularly with 1 to 8 carbon atoms), a halogen atom or the like. They are still more preferably an alkoxy group, further preferably alkoxy group with 1 to 4 carbon atoms, because the effect of preventing a charge-up phenomenon and the effect of stabilizing PED are excellent. $M^1$ to $M^4$ are most preferably a hydrogen ion which is less likely to influence the properties of a chemical amplification resist. Examples of the aromatic ammonium ion include ammonium ions of aniline, 2-methoxyaniline, 3-methoxyaniline, 4-methoxyaniline, and derivatives thereof having these skeletons, and examples of the quaternary ion of an aromatic heterocyclic ring include ammonium ions of piperidine, pyrrolidine, morpholine, piperazine, pyridine, α-picoline, β-picoline, γ-picoline, quinoline, isoquinoline, pyrroline, and derivatives thereof having these skeletons.

The solvent as the component (b) may be water, an organic solvent, or a mixture of water with an organic solvent. The organic solvent is not particularly limited so far as it can dissolve the polymer comprising the repeating units represented by the formulae (1) and (2). Preferred organic solvents include alcohols such as methanol, ethanol, and isopropyl alcohol; ketones such as acetone, methyl ethyl ketone, and methyl isobutyl ketone; ethylene glycols such as ethylene glycol, methoxyethanol, ethoxyethanol, and ethyl ethoxyacetate; propylene glycols such as propylene glycol, methyl propylene glycol, and ethyl propylene glycol; and hydroxy esters such as ethyl lactate, methyl lactate, methyl α-hydroxyisolactate, ethyl α-hydroxyisolactate, ethyl β-methoxyisolactate, and methyl α-methoxyisolactate. They may be used alone or as a mixture thereof with water in any ratio of the solvent to water. The use of water alone or a combination of water with an alcohol, such as methanol, ethanol, n-propanol, or i-propanol, is particularly preferred.

Since the composition composed mainly of (a) a soluble aniline polymer and (b) a solvent according to the present invention is usually weakly acidic or acidic, it may further comprise (c) a base for pH adjustment.

Preferred examples of the component (c) include ammonia and amines such as aliphatic amines with 1 to 8 carbon atoms, preferably 1 to 4 carbon atoms, aromatic amines, heterocyclic amines, and quaternary salts of these amines.

Examples of the aliphatic amines include compounds represented by the following formula (4)

wherein $R^5$ to $R^7$ are each independently a hydrogen atom or an alkyl group with 1 to 4 carbon atoms.

Examples of the quaternary salts of aliphatic amines include compounds represented by the following formula (5)

wherein $R^8$ to $R^{11}$ are each independently a hydrogen atom or an alkyl group with 1 to 4 carbon atoms and X represents a hydroxyl or sulfone group.

Preferred examples of the aromatic amines include aniline, 2-methoxyaniline, 3-methoxyaniline, 4-methoxyaniline, and derivatives thereof having these skeletons or ammonium hydroxide compounds of above amines.

Preferred examples of the heterocyclic amines include piperidine, pyrrolidine, morpholine, piperazine, pyridine, α-picoline, β-picoline, γ-picoline, quinoline, isoquinoline, pyrroline, and derivatives thereof having these skeletons or ammonium hydroxide compounds of the above amines.

Among these bases, ammonia and amines with 1 to 2 carbon atoms are particularly preferred.

The addition of a component (d) to the solution used in the present invention contributes to a further improvement in the stability of the sensitivity against the post exposure delay (PED), which is a period between exposure and baking after the exposure, the coatability and the like.

The component (d) is preferably at least one compound, having an acidic group, selected from:

(A) a compound containing an acidic group; and (B) a polymer containing an acidic group. A sulfone group or a carboxyl group is preferred as the acidic group.

The compound (A) containing an acidic group is not particularly limited so far as it has in its molecule a sulfone group or a carboxyl group. Preferred examples thereof include benzenesulfonic acid, camphorsulfonic acid, alkoxybenzenesulfonic acids, alkylbenzenesulfonic acids, alkylsulfonic acids, α-olefinalkylsulfonic acids, alkylnaphthalenesulfonic acids, alkylsulfoacetic acids, benzoic acid, alkoxybenzenecarboxylic acids, alkylbenzenecarboxylic acids, aliphatic carboxylic acids, camphor carboxylic acid, and salts of the above compounds.

The alkyl group has preferably 1 to 24 carbon atoms, still preferably 1 to 18 carbon atoms. The alkoxy group has preferably 1 to 18 carbon atoms, still preferably 1 to 12 carbon atoms.

The polymer (B) containing an acidic group is a polymer comprising at least 10% of repeating units containing a sulfone or carboxyl group. More specifically, it refers to a polymer of at least one monomer selected from the group consisting of (i) a group of monomers containing a sulfone or carboxyl group or a copolymer of at least two monomers respectively selected from the group consisting of (i) a group of monomers containing a sulfone or carboxyl group and (ii) a group of monomers containing neither a sulfone group nor a carboxyl group.

This will now be described in more detail.

The monomer (i) having an acidic group is not particularly limited so far as it has an acidic group in its molecule, and preferred examples thereof include vinylbenzenesulfonic acids such as vinylbenzenesulfonic acid and allylbenzenesulfonic acid; sulfonated olefins such as allylsulfonic acid and methacrylsulfonic acid; N-sulfoalkyl acrylamides such as 2-acrylamidopropanesulfonic acid, 2-acrylamido-2-methylpropanesulfonic acid, 2-acrylamido-n-dodecanesulfonic acid, and 4-acrylamidobenzenesulfonic acid; N-sulfoalkylmethacrylamides such as 2-methacrylamidopropanesulfonic acid, 2-methacrylamido-2-methylpropanesulfonic acid, 2-methacrylamido-n-dodecanesulfonic acid, and 4-methacrylamidobenzenesulfonic acid; acrylic esters such as 4-sulfophenyl acrylate, 3-sulfopropyl acrylate, 2-sulfo-2-methylpropyl acrylate, and 2-hydroxy-3-sulfopropyl acrylate; methacrylic esters such as 4-sulfophenyl methacrylate, 3-sulfopropyl methacrylate, 2-sulfo-2-methylpropyl methacrylate, 2-hydroxy-3-sulfopropyl methacrylate, and 2-سulfoethyl methacrylate; acrylic acids and methacrylic acids such as acrylic acid, methacrylic acid, and 2-butylacrylic acid; and salts of the above compounds.

The monomer (ii) not containing an acid group is not particularly limited so far as it has a double bond copolymerizable with the above monomer (i). Preferred examples thereof include acrylic esters such as methyl acrylate, butyl acrylate, hexyl acrylate, and dodecyl acrylate; methacrylic esters such as methyl methacrylate, ethyl methacrylate, butyl methacrylate, hexyl methacrylate, and dodecyl methacrylate; styrenes such as styrene and α-methyl styrene; acrylamides and methacrylamides such as acrylamide, methacrylamide, N-methyl acrylamide, N-ethyl acrylamide, N-methyl methacrylamide, and N-ethyl methacrylamide; and acrylonitriles and methacrylonitriles such as acrylonitrile, methacrylonitrile, and 2-ethyl acrylonitrile.

The monomer (i) may be used alone for polymerization or in combination of two or more of them for copolymerization. Alternatively, at least two monomers respectively selected from a group of monomers (i) and a group of monomers (ii).

The sulfone group and carboxyl group in the above copolymers may be in any of acid and salt forms.

The content of the monomer (i) in the copolymer is preferably at least 20%, still more preferably not less than 30%, further preferably not less than 50%.

The molecular weight of the polymer (B) is preferably 300 to 200,000, still more preferably 500 to 100,000.

Regarding the proportions of the individual components, the content of the soluble aniline polymer as the component (a) is 0.01 to 30 parts by weight, preferably 0.1 to 20 parts by weight, still preferably 0.2 to 10 parts by weight, based on 100 parts by weight of the solvent as the component (b).

When the component (c) is used, the content of the component (c) is preferably 0.01 to 15 parts by weight, still more preferably 0.05 to 10 parts by weight, further preferably 0.1 to 5 parts by weight, based on 100 parts by weight of the solvent as the component (b), and when the component (d) is used, the content of the component (d) is preferably 0.001 to 30 parts by weight, more preferably 0.005 to 20 parts by weight, still more preferably 0.01 to 10 parts by weight.

When the content of the component (c) exceeds 15 parts by weight, a lowering in conductivity or a rapid lowering in sensitivity occurs. When the content of the component (d) exceeds 30 parts by weight, the effect of preventing a charge-up phenomenon or the effect of stabilizing the sensitivity against PED are lowered.

The composition of the present invention may, if necessary, contains surfactants, binder polymers, preservatives, adhesion assistants and the like.

The binder polymer which may be optionally added to the composition of the present invention is preferably a water-soluble polymer compound or a polymer compound which can form an aqueous emulsion.

Specific examples of the water-soluble polymer compound include polyvinyl alcohols, such as polyvinyl alcohol, polyvinyl formal, and polyvinyl butyral, polyacrylamides, such as polyacrylamide, poly(N-t-butyl acrylamide), and polyacrylamidemethylpropanesulfonic acid, polyvinyl pyrrolidone, water-soluble alkyd resins, water-soluble melamine resins, water-soluble urea resins, water-soluble phenol resins, water-soluble epoxy resins, water-soluble polybutadiene resins, water-soluble acrylic resins, water-soluble urethane resins, water-soluble acrylic/styrene copolymer resins, water-soluble vinyl acetate/acrylic copolymer resins, water-soluble polyester resins, water-soluble styrene/maleic acid copolymer resins, water-soluble fluororesins, and copolymers thereof.

Specific examples of the polymer compound which can form an aqueous emulsion include aqueous alkyd resins, aqueous melamine resins, aqueous urea resins, aqueous phenol resins, aqueous epoxy resins, aqueous polybutadiene resins, aqueous acrylic resins, aqueous urethane resins, aqueous acrylic/styrene copolymer resins, aqueous vinyl acetate resins, aqueous vinyl acetate/acrylic copolymer resins, aqueous polyester resins, aqueous styrene/maleic acid copolymer resins, aqueous acrylic/silicone resins, aqueous fluororesins, and copolymers thereof.

The above polymer compounds may be used alone or as a mixture of two or more of them in any mixing ratio.

The addition of a surfactant to the composition of the present invention results in improved flatness, coatability, and conductivity.

Examples of the surfactant include anionic surfactants such as alkylsulfonic acids, alkylbenzenesulfonic acids, alkylcarboxylic acids, alkylnaphthalenesulfonic acids, α-olefinsulfonic acids, dialkylsulfosuccinic acids, α-sulfonated fatty acids, N-methyl-N-oleintaurines, petroleum sulfonic acids, alkylsulfonic acids, sulfated fats and oils, polyoxyethylene alkyl ether sulfates, polyoxyethylene styrenated phenyl ether sulfates, alkylphosphoric acids, polyoxyethylene alkyl ether phosphates, polyoxyethylene alkyl phenyl ether phosphates, condensates of naphthalenesulfonic acid with formaldehyde, and salts thereof; cationic surfactants such as primary to tertiary fatty amines, quaternary ammoniums, tetraalkylammoniums, triaklylbenzylammoniumalkylpyridiniums, 2-alkyl-1-alkyl-1-hydroxyethylimidazoliums, N,N-dialkylmorpholiums, polyethylene polyamine fatty acid amides, urea condensates of polyethylene polyamine fatty acid amides, quaternary ammoniums of urea condensates of polyethylene polyamine fatty acid amides, and salts thereof; amphoteric surfactants, for example, betaines, such as N,N-dimethyl-N-alkyl-N-carboxymethyl ammonium betaines, N,N,N-trialkyl-N-sulfoalkylene ammonium betaines, N,N-dialkyl-N,N-bispolyoxyethylene ammonium sulfuric ester betaines, 2-alkyl-1-carboxymethyl-1-hydroxyethylimidazoliumbetaines, and aminocarboxylic acids, such as N,N-dialkylaminoalkylenecarboxylates; nonionic surfactants such as polyoxyethylene alkyl ethers, polyoxyethylene alkyl phenyl ethers, polyoxyethylene polystyryl phenyl ether, polyoxyethylene-polyoxypropylene glycol, polyoxyethylene-polyoxypropylene alkyl ethers, partial esters of fatty acids with polyhydric alcohols, partial esters of fatty acids with polyoxyethylene polyhydric alcohols, polyoxyethylene fatty acid esters, polyglycerin fatty acid esters, polyoxyethylenated castor oils, fatty acid diethanolamides, polyoxyethylene alkylamines, partial esters of fatty acids with triethanolamine, and trialkylamine oxides; and fluorosurfactants such as fluoroalkylcarboxylic acids, perfluoroalkylcarboxylic acids, perfluoroalkylbenzenesulfonic acids, and perfluoroalkyl polyoxyethylene ethanols. The alkyl group has preferably 1 to 24 carbon atoms, still preferably 3 to 18. At least two surfactants may be used in combination without any problem.

In the present invention, in the case of a conductive composition containing the component (c), nonionic surfactants among the above surfactants are particularly preferably used. Especially preferred are polyoxyethylenes represented by the general formula HO(CH$_2$CH$_2$O)$_n$R wherein R represents a straight-chain or branched alkyl group with 1 to 24 carbon atoms or a phenyl group substituted with a straight-chain or branched alkyl group with 1 to 24 carbon atoms, n is the number of repetitions of the oxyethylene group and 1 to 100.

Preferred examples of the polyoxyethylenes include polyoxyethylene alkyl ethers and polyoxyethylene alkylphenyl ethers, and polyoxyethylene alkylphenyl ethers are still more preferred.

The number of repetitions of the oxyethylene group is preferably 5 to 100, still more preferably 10 to 100.

In the case of a conductive composition not containing the component (c), anionic surfactants among the above surfactants are particularly preferred. Especially preferred are surfactants having, in their molecule, an anionic group such as a sulfone or carboxyl group.

At least two surfactants may be used in combination without any problem.

A conductive film can be formed from the composition for irradiation with an ionizing radiation according to the present invention simply by spin coating and heating, that is, by a simple process. Specifically, a conductive film can be formed by coating the composition of the present invention to form a 0.01 to 5 μm-thick coating and heat-treating the coating at a temperature of 300° C. or below, preferably 20° to 250° C.

Electron beam exposure can be done, for example, by direct scanning method, blanking aperture (BA) method, or block exposure method using stencil mask, and so on.

BRIEF DESCRIPTION OF THE DRAWINGS

FIGS. 8A to 8I are flow diagrams showing the formation of a pattern after coating a conductive film on a three-layer resist.

FIGS. 9A to 9F are flow diagrams showing the formation of a pattern after coating a conductive film on a lower resist layer in a two-layer resist.

FIG. 20 is an IR spectrum of Conductive Polymer No. 1 (in a sulfonic-group-free form) synthesized in a working example.

Figure 1A:
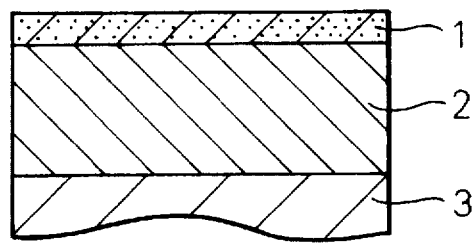
FIGS. 1A–1C are block diagrams showing an embodiment wherein a conductive film is formed as the upper most layer a single layer resist in FIG. 1A, a two-layer resist in FIG. 1B, and a three-layer resist in FIG. 1C.
Figure 1B:
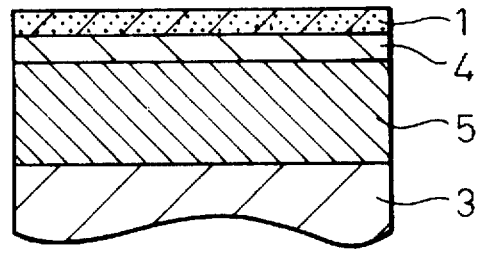
Figure 1C:
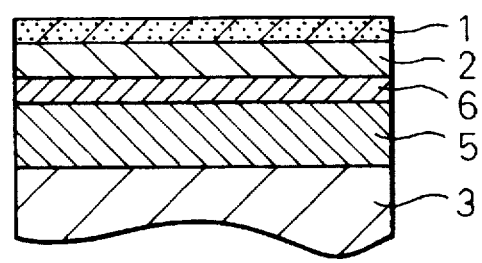

When the composition for irradiation with an ionizing irradiation according to the present invention is applied to pattern formation, the formation of a conductive film on the top surface of a resist is most preferred (see FIGS. 1A, 1B and 1C). Alternatively, the conductive film may be formed on a different place. More specifically, a conductive film may be formed on an intermediate layer in a two-layer resist structure (FIG. 2) or on an intermediate layer (FIG. 3) or on an underlying resist (FIG. 4) in a three-layer resist structure. Further, the conductive film may be used as a flattening layer in a two-or three-layer resist (FIG. 5A or 5B).

In FIGS. 1A to 1C, FIGS. 2 to 4, and FIGS. 5A and 5B, numeral 1 designates a conductive film, numeral 2 a resist, numeral 3 a substrate, numeral 4 a silicon-containing resist, numeral 5 a flattening layer (lower layer), and numeral 6 designates an $SiO_2$ film (an intermediate layer in a three-layer resist).

Thus, according to the pattern forming method of the present invention using the above composition for irradiation with an ionizing radiation, the following three embodiments are provided:

(1) A method for forming a pattern, characterized by comprising the steps of: coating a composition, for irradiation with an ionizing radiation, on a resist film provided on an object to be treated, thereby forming a coating;

pattern-wise exposing the coated object to an ionizing radiation; and either peeling the coating and then developing the resist film to form a pattern or developing the resist film simultaneously with peeling of the coating to form a pattern.

(2) A method for forming a pattern, characterized by comprising the steps of: coating a first resist on an object to be treated to form a first resist film;

coating a composition, for irradiation with an ionizing radiation, on the first resist film to form a coating;

coating a second resist on the coating to form a second resist film;

pattern-wise exposing the coated object to an ionizing radiation;

developing the second resist film to form a second resist pattern; and etching the coating and the first resist film using the second resist pattern as a mask to form a multilayer resist pattern.

(3) A method for forming a pattern, characterized by comprising the steps of: coating a composition, for irradiation with an ionizing radiation, on an object to be treated to form a coating;

coating a resist on the coating to form a resist film;

pattern-wise exposing the coated object to an ionizing radiation; and developing the resist film and the coating to form a multilayer resist pattern.

Figure 2:
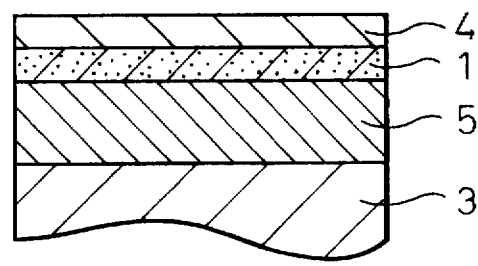
FIG. 2 is a block diagram showing an embodiment wherein a conductive film is formed as an intermediate layer in a two-layer resist.
Figure 3:
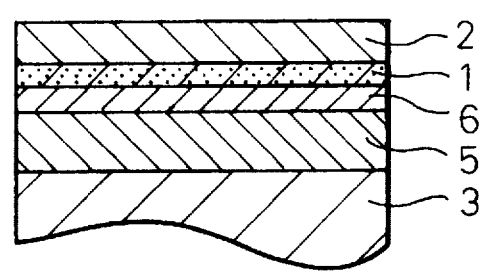
FIG. 3 is a block diagram showing an embodiment wherein a conductive film is formed on an intermediate layer in a three-layer resist.
Figure 4:
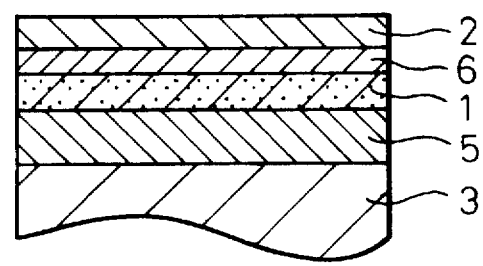
FIG. 4 is a block diagram showing an embodiment wherein a conductive film is formed on the underside of an intermediate layer in a three-layer resist.
Figure 5A:
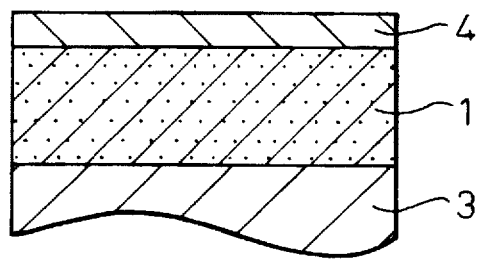
FIGS. 5A and 5B are block diagrams showing an embodiment wherein a conductive film is formed as a flattening layer (undermost layer) in a two-layer resist (FIG. 5A) and a three-layer resist (FIG. 5B).
Figure 5B:
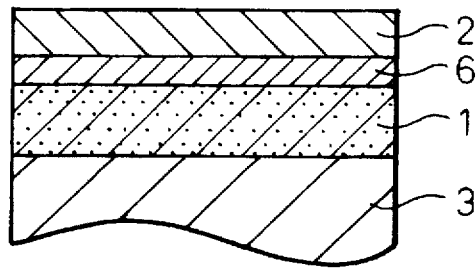

The composition of the present invention serves to prevent a resist 2 from being electrified in a construction shown in FIG. 1A; to prevent, for example, a siliconcontaining resist 4 and a flattening layer 5 from being electrified in a construction shown in FIG. 1B; to prevent a resist 2, for example, an $SiO_2$ film 6 and a flattening layer 5, from being electrified in a construction shown in FIG. 1C; to prevent mainly a flattening layer 5 from being electrified in a construction shown in FIG. 2; to prevent mainly an $SiO_2$ film 6 and a flattening layer 5 from being electrified in a construction shown in FIG. 3; and to prevent mainly a flattening layer 5 (or $SiO_2$ film 6) from being electrified in a construction shown in FIG. 4.

FIG. 5A and FIG. 5B show an embodiment wherein a resist is incorporated into the composition for irradiation with an ionizing radiation and the composition is then coated to form a flattening layer (a lower layer). In this embodiment, the composition serves to prevent the electrification of the resist per se incorporated thereinto.

Substrates to which the pattern formation method according to the present invention is applicable include a silicon (Si) semiconductor, a gallium-arsenic (GaAs) substrate, or a mask substrate. The resist may be of any of negative-working and positive-working resists by selecting a solvent, which does not mix with the resist to form a mixed layer, as the solvent to be used in the present invention so far as the resist is sensitive to ionizing radiations such as an electron beam or an ion beam. Preferred examples of a single-layer resist and an upper resist in the three-layer resist include a resist composed mainly of a novolak, bisphenol, acrylamide, styrene, methacrylic or other polymer, and preferred examples of an upper resist in the two-layer resist include a silicon-containing resist. Preferred examples of an intermediate resist in the three-layer resist include a silicone polymer resist, and preferred examples of a lower resist in the two-layer resist and the three-layer resist include a novolak or styrene polymer resist.

In the method of the present invention, the resist film may be formed, for example, by spin-coating a resist on a substrate and prebaking the coating.

Further, in the pattern formation method of the present invention, the conductive film may be formed by coating the composition, for irradiation with an ionizing radiation, according to the present invention, for example, on a previously formed resist film, for example, by spin coating and prebaking the coating.

In the irradiation with an ionizing radiation according to the present invention, irradiation with an electron beam (EB) or an ion beam is typical from the viewpoint of preventing a charge-up phenomenon. However, irradiation with UV light, far UV, X-ray or the like is also possible because it has the effect of improving the stability of a chemical amplification resist.

Preferably, the exposing device used has such a structure that the conductive film can electrically communicate with the outside.

The peeling of the conductive film may be carried out in (c) water containing an amine and/or a quaternary ammonium salt, a water-containing organic solvent, or an organic solvent. In the case of a resist developed with an aqueous organic alkali solution, the development and the peeling may be simultaneously carried out because the conductive film is soluble with a developing solution.

Another advantage of the ionizing radiation irradiation method of the present invention is that the method can be applied to ion implantation. Specifically, in ion implantation, an ion is implanted into an object to be treated, and an ion beam, which is a charged beam, is scanned. Here again, a conductive film for preventing a charge-up phenomenon is applied onto the surface of an object to be treated.

Therefore, according to a further aspect of the present invention, there is provided an ion implantation method characterized by comprising the steps of: coating the above composition, for irradiation with an ionizing radiation, on an object bearing ions implantation mask to form a coating; and implanting an ion into the object.

Further, the composition for irradiation with an ionizing radiation according to the present invention has excellent electrical conductivity and, at the same time, can be easily peeled (i.e., can be easily soluble in a solvent). Therefore, by taking advantage of these properties, it can be applied to the observation of a sample using an ionizing radiation or a measuring method using an ionizing radiation, more specifically observation under an electron microscope or an EB tester for ICs using an electron beam as a probe.

For example, it is known that, during observation under an electron microscope, a conductive coating is provided on the surface of a sample to be examined to prevent an electron beam from being distorted due to a charge-up phenomenon. Furthermore, the application of EB (electron beam) onto the surface of an LSI chip results in emission of secondary electrons, and the potential of the portion irradiated with EB can be determined by analyzing the energy distribution of the secondary electrons. This enables the operation state of LSI to be examined and, at the same time, a potential distribution image of LSI to be measured by scanning the irradiation electron beam. In this case as well, a conductive coating is provided on the sample to prevent the charge-up phenomenon. The deposition of a metal has hitherto been used as the conductive coating. This, however, disadvantageously results in damage to the underlying layer when the metallic layer is peeled off. The use of the composition, for irradiation with an ionizing radiation, according to the present invention can solve the above problems.

Thus, according to a further aspect of the present invention, there is provided a method for observing or measuring a sample, characterized by comprising the steps of: coating the above composition, for irradiation with an ionizing radiation, on a sample;

irradiating the sample with a charged particle beam (such as electron beam); and detecting the charged particle beam (electron beam) reflected from the sample or the radiation released from the sample.

When the composition for irradiation with an ionizing radiation and the pattern formation method according to the present invention is applied to lithography using an ionizing radiation, such as an electron beam, electric charges accumulated within the resist at the time of exposure to an electron beam or the like can be shielded by earth potential of the conductive film by virtue of high conductivity of the composition of the present invention. Therefore, there is no interaction between electric charges during exposure, enabling misregistration of the pattern and lowering in dimensional accuracy to be completely prevented. Further, coating on a chemical amplification resist can prevent inclusion of impurities from the outside, enabling stability in a period (PED) between the exposure and the baking after the exposure to be improved. Furthermore, according to the present invention, a film can be formed from the composition of the present invention by spin coating using an aqueous solvent and/or an organic solvent. Therefore, a solvent, which does not mix with the resist to form a mixed layer, can be selected as the solvent for a coating solution, enabling a charge-up phenomenon to be prevented without sacrificing the properties of the resist. Furthermore, the film can be easily peeled off with water and/or an organic solvent, simplifying the process.

The application of the composition for irradiation with an ionizing radiation according to the present invention to ion implantation or observation or measurement of a sample can offer the same mode of operation and effect as described above.

The present invention will now be described in more detail with reference to the following examples, though it is, of course, not limited to these examples only.

EXAMPLES

The present invention will now be described with reference to the following examples.

IR spectra were obtained using a model 1600 apparatus manufactured by Perkin-Elmer Corp., and UV and visible spectra were obtained using a UV-3100 apparatus manufactured by Shimadzu Seisakusho Ltd.

The molecular weight distribution and the molecular weight were measured by GPC (in terms of polystyrene) using GPC columns for N,N-dimethylformamide. Three types of columns for N,N-dimethylformamide were connected to one another. A solution of 10 mM/liter triethylamine and 100 mM/liter lithium bromide in N,N-dimethylformamide was used as an eluent. Regarding the conductivity, the electrical conductivity was measured by the four-terminal method, and the surface resistance was measured by the two-terminal method.

[Synthesis of soluble aniline polymer]

A soluble aniline polymer used in the present invention was synthesized by a method described in Japanese Patent Application Nos. 5-353698 and 6-183882 (see Table 1). 100 mmol of 3-amino-4-methoxybenzenesulfonic acid was dissolved at 25° C. in a 4 mol/liter aqueous ammonia with stirring, and a 100 mmol aqueous solution of ammonium peroxydisulfate was dropwise added thereto. After the completion of the dropwise addition, the mixture was stirred at 25° C. for 12 hr. The resultant reaction product was collected by filtration, washed, and dried to give 15 g of a polymer powder (Polymer No. 1).

This polymer had a surface resistance of 9.0 Ωcm. As a result of the measurement of the molecular weight, the polymer was found to have a number average molecular weight of 200,000, a weight average molecular weight of 330,000, a Z average molecular weight of 383,000, and a degree of dispersion of 1.65 in terms of MW/MN and 1.16 in terms of MZ/MW.

Figure 16:
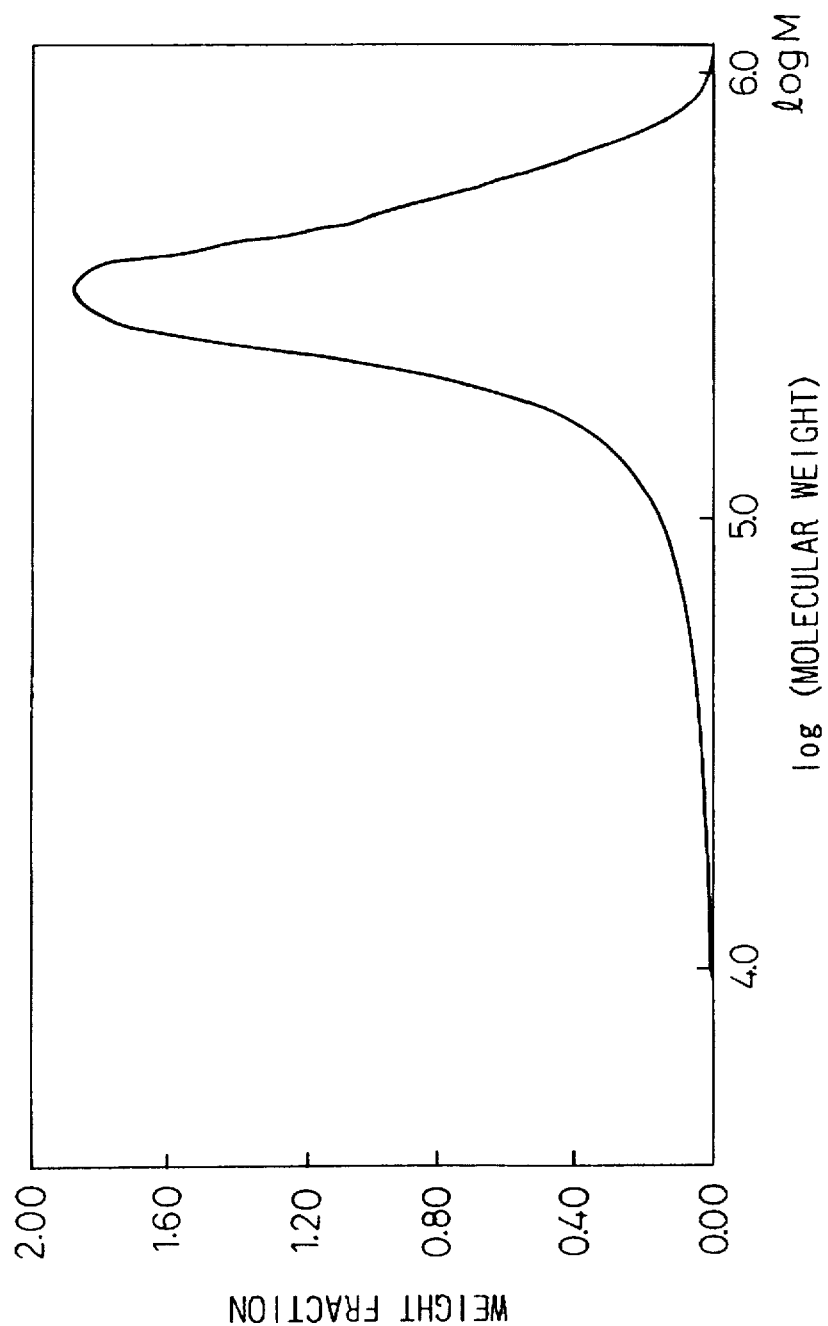
FIG. 16 is a chart showing the results of measurement of the molecular weight of Conductive Polymer No. 1 synthesized in a working example.

FIG. 16 is a chart obtained in the measurement of the molecular weight of Polymer No. 1.

Figure 17:
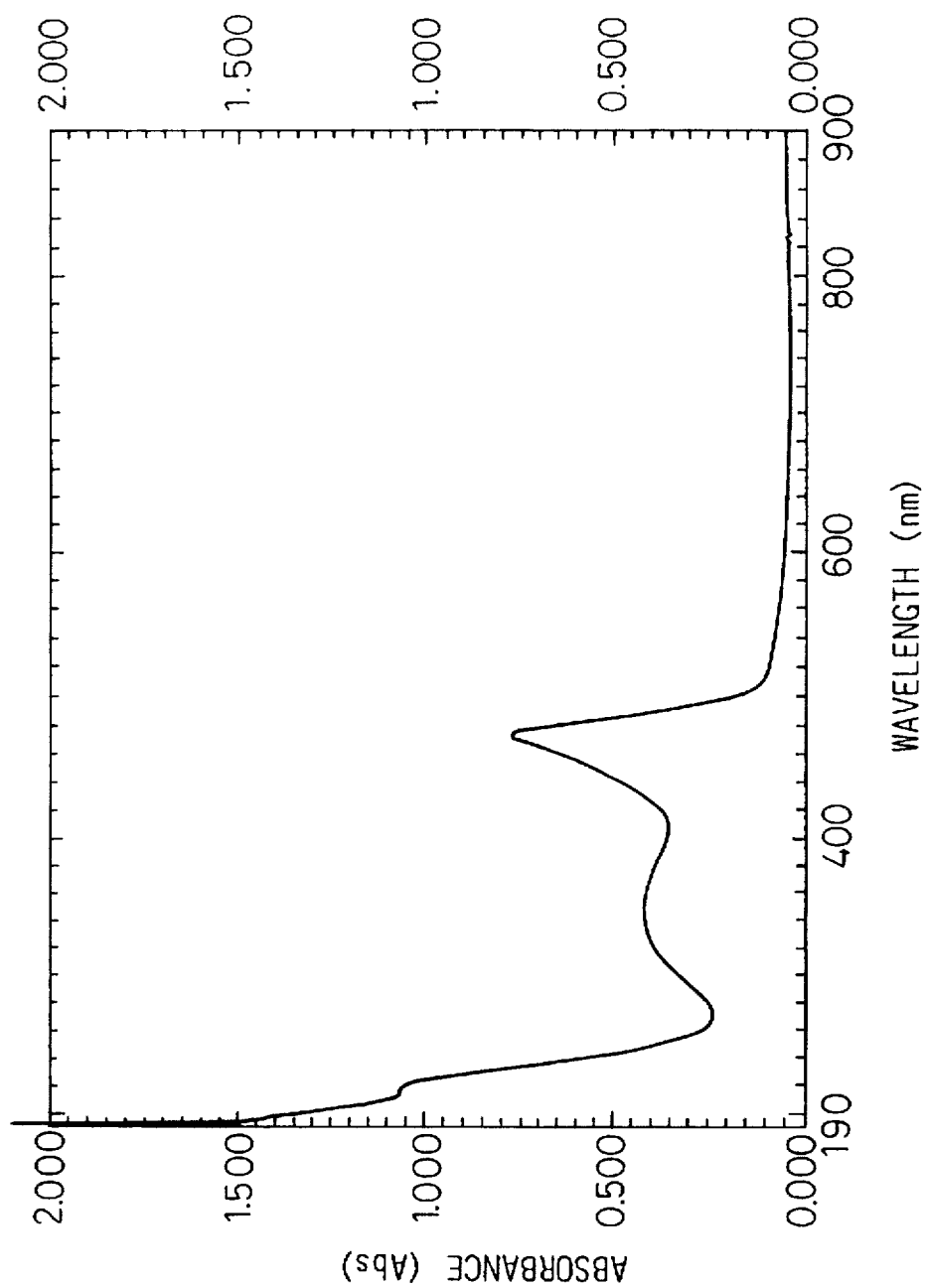
FIG. 17 is a spectrum in UV and visible regions, i.e., 190 nm to 900 nm, of Conductive Polymer No. 1, synthesized in a working example, as a 0.1 mol/liter aqueous sulfuric acid solution.
Figure 18:
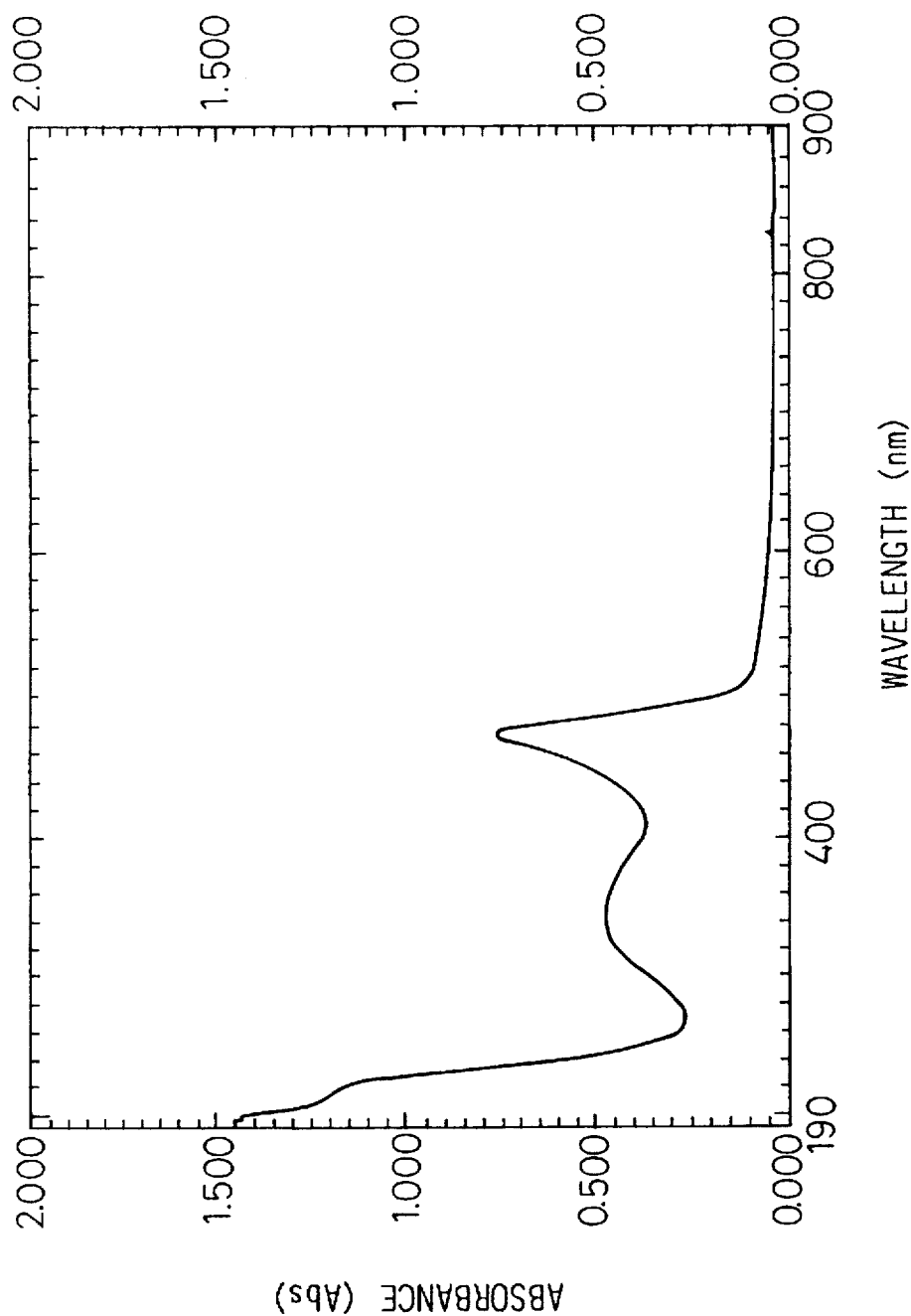
FIG. 18 is a spectrum in UV and visible regions, i.e., 190 nm to 900 nm, of Conductive Polymer No. 1, as an aqueous solution.
Figure 19:
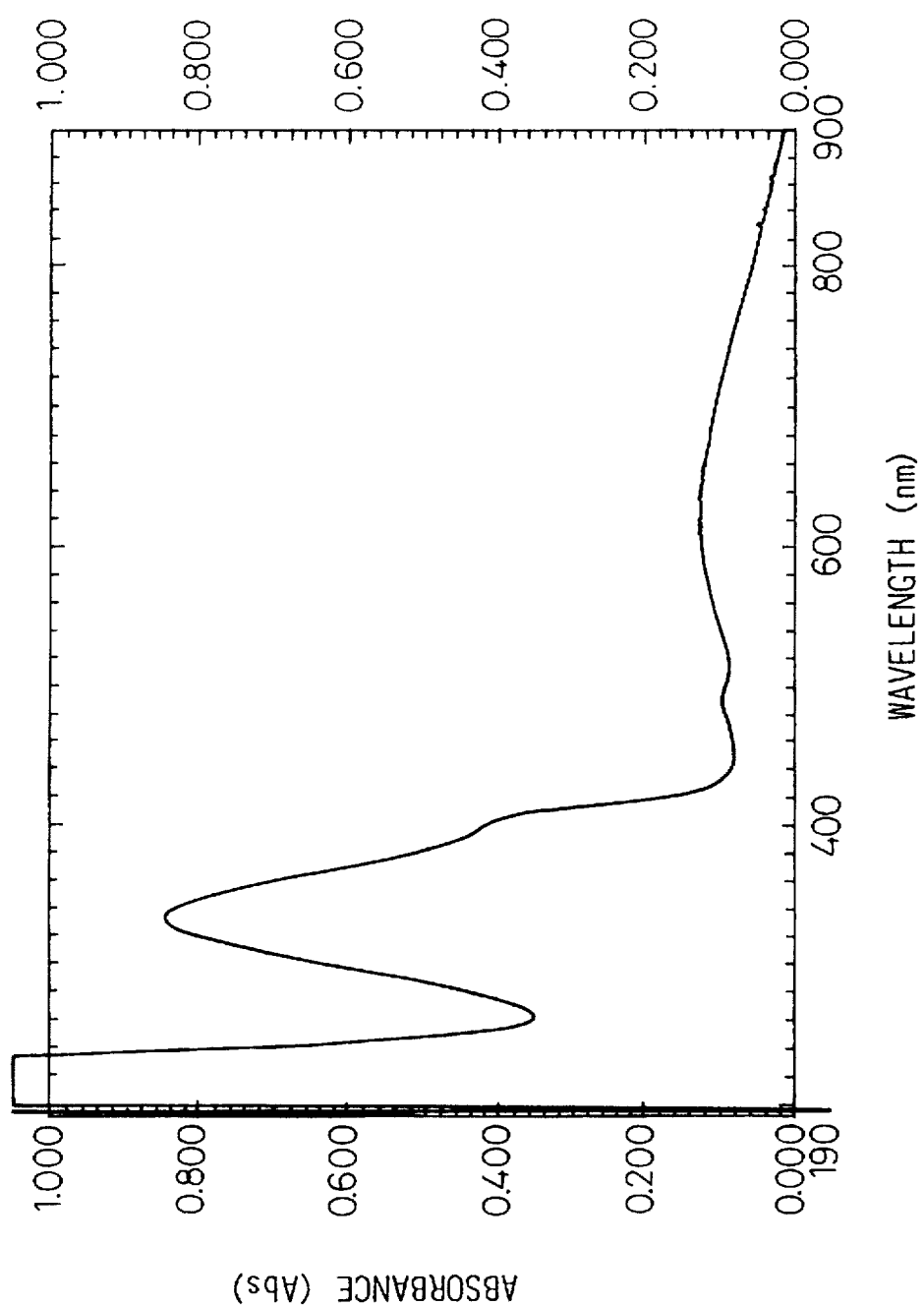
FIG. 19 is a spectrum in UV and visible regions, i.e., 190 nm to 900 nm, of Conductive Polymer No. 1, synthesized in a working example, as a 0.2 mol/liter aqueous ammonia solution.

FIG. 17 is a spectrum in UV and visible regions, i.e., 190 nm to 900 nm, of Polymer No. 1 in a 0.1 mol/liter aqueous sulfuric acid solution. FIG. 18 is a spectrum in UV and visible regions, i.e., 190 nm to 900 nm, of Polymer No. 1 in an aqueous solution. FIG. 19 is a spectrum in UV and visible regions, i.e., 190 nm to 900 nm, of Polymer No. 1 in a 0.2 mol/liter aqueous ammonia solution . FIG. 20 is an IR spectrum of Polymer No. 1 (in a sulfonic-group-free form).

The assignment of the IR spectrum is as follows.

Sulfonic group: absorption around 1120 cm$^-$ and 1020 cm$^-$.

Ammonium salt of sulfonic group: absorption around 1400 cm$^-$.

Skeleton of polymer: absorption around 1500 cm$^-$.

1 part by weight of the polymer was dissolved at room temperature in 100 parts by weight of water with stirring to prepare a conductive composition. The composition had pH about 3.5, suggesting that not less than about 80% of the sulfonic group is in free form.

Polymer Nos. 2 to 6 were prepared in the same manner as described above.

The yield, conductivity, solubility, viscosity, and weight average molecular weight of these polymers are given in Table 1. The conductivity was measured by the two-terminal method for a film which had been coated on an Si wafer at 2000 rpm and then baked at 80° C. for one min. The solubility was judged based on whether or not insolubles were present when 3 g of the polymer was dissolved in 100 g of water. The viscosity was measured at 25° C. on a solution of 3 g of the polymer dissolved in 100 g of water.

From the above results, the polymer is considered to be an oligomer or a low-molecular weight polymer.

TABLE 1

| Polymer | Monomer | Solvent | Basic compound | Yield | Conductivity | Solubility | Viscosity | Wt. av. mol. wt. |
|---|---|---|---|---|---|---|---|---|
| 1 | 3-Amino-4-methoxy-benzene sulfonic acid | Water | $NH_3$ | 70% | 9 $\Omega \cdot cm$ | ☉ | 3.5 | 330,000 |
| 2 | 3-Amino-4-methoxy-benzene-sulfonic acid | Water | NH iPr$_2$ | 75% | 6 $\Omega \cdot cm$ | ☉ | 5.0 | 420,000 |
| 3 | 2-Amino-4-methoxy-benzene-sulfonic acid | Water | $NH_3$ | 65% | 45 $\Omega \cdot cm$ | ☉ | 3.7 | 280,000 |
| 4 | 3-Amino-4-methoxy-benzene-sulfonic acid | Water | $NH_3$ | 35% | 100 $\Omega \cdot cm$ | ☉ | 3.5 | 210,000 |
| 5 | 3-Amino-4-methoxy-benzene-sulfonic acid | Water | $NH_3$ | 60% | 15 $\Omega \cdot cm$ | ☉ | 3.6 | 150,000 |
| 6 | o-Amino-benzene-sulfonic acid | Water | $NH_3$ | 45% | 1000 $\Omega \cdot cm$ | ☉ | 3.0 | 110,000 |
| 7 | o-Amino-benzene-sulfonic acid | Water | None | Impossible to isolate | Not less than $10^5$ $\Omega \cdot cm$ | ☉ | 1.2 | Immeasurable* |
| 8 | 3-Amino-4-methoxy-benzene sulfonic acid and N-phenyl-p-phenylene-diamine | Water | None | 80% | 20 $\Omega \cdot cm$ | ☉ | 4.5 | 350,000 |

*Evaporated to dryness under reduced pressure to give a polymer.

For comparison, according to a method described in Japanese Unexamined Patent Publication (Kokai) No. 06-56987, 0.125 mol/liter of o-aminobenzenesulfonic acid was subjected to oxidative polymerization in sulfuric acid (0.5 mol/liter) in the presence of 0.25 mol/liter of potassium permanganate, and the reaction mixture was evaporated to dryness under reduced pressure to give a polymer (Polymer No. 7).

3 parts by weight of the polymer was dissolved in 100 parts by weight of water, spin-coated on a resist in order to from a film. However, no uniform conductive film was formed.

For this polymer, it was impossible to carry out the measurement under the above GPC conditions.

[Preparation of coating solution]

Compositions of coating solutions used in the following examples and comparative examples, pH values of the solutions, and the surface resistance (value for reference) of films formed by coating the coating solution on an Si wafer at 2000 rpm and baking the coating at 80° C. for one min are given in Table 2.

TABLE 2

| Composition No. | Ex./Comp. Ex. | (a) Polymer | (b) Solvent | (c) Component | (d) Component | Surface resistance ($\Omega$/) | pH of soln. |
|---|---|---|---|---|---|---|---|
| 1 | Ex. 2, 8, 11, 12 | Poly.1: 2 parts by wt. | Water: 100 parts by wt. | — | — | $8.6 \times 10^5$ | 2.8 |

TABLE 2-continued

| Composition No. | Ex./ Comp. Ex. | (a) Polymer | (b) Solvent | (c) Component | (d) Component | Surface resistance (Ω/) | pH of soln. |
|---|---|---|---|---|---|---|---|
| 2 | Ex. 4, 10 | Poly.1: 3 parts by wt. | Water: 100 parts by wt. | $NH_3$:0.15 part by wt. | — | $5.2 \times 10^5$ | 6.5 |
| 3 | Ex. 1, 9 | Poly.1: 1 part by wt. | Water 100 parts by wt. | — | DBS: 0.1 part by wt. | $1.5 \times 10^5$ | 2.1 |
| 4 | Ex. 3, 11 | Poly.2: 2 parts by wt. | Water 5/IPA$^1$: 100 parts by wt. | — | PAMPS: 1.0 part by wt. | $3.3 \times 10^6$ | 3.6 |
| 5 | Ex. 5 | Poly.3: 2 parts by wt. | Water: 100 parts by wt. | $NMe_2Et$: 0.8 part by wt. | — | $5.7 \times 10^6$ | 6.8 |
| 6 | Ex. 8 | Poly.4: 5 parts by wt. | Water 5/IPA$^1$: 100 parts by wt. | — | — | $8.0 \times 10^6$ | 3.8 |
| 7 | Ex. 6 | Poly.5: 2 parts by wt. | Water: 100 parts by wt. | — | P(AMPS-AA): 0.5 part by wt. | $1.3 \times 10^7$ | 3.2 |
| 8 | Comp. Ex. 1 | Poly.6: 3 parts by wt. | Water 100 parts by wt. | $NH_3$ 0.1 part by wt. | — | $5.6 \times 10^9$ | 3.0 |
| 9 | — | Poly.7: 3 parts by wt. | Water 100 parts by wt. | $NH_3$: 0.1 part by wt. | — | Impossible to form a film | 4.5 |
| 10 | Comp. Ex. 3 | Poly.8: 3 parts by wt. | Water: 100 parts by wt. | $NH_3$: 0.2 part by wt. | — | $6.3 \times 10^7$ | 9.5 |

Abbreviations:
DBS = dodecylbenzenesulfonic acid
PAMPS = polymer of tert-butylacrylamidesulfonic acid
P(AMPS-AA) = copolymer of acrylamide with tert-butylacrylamidosulfonic acid
Poly. = Polymer No.

Example 1
(Pattern formation wherein polymer composition is coated on positive-working chemical amplification resist)

A 0.7 μm-thick positive-working chemical amplification resist (comprising 100 parts by weight of a polyvinyl phenol/t-butyl methacrylate copolymer [comonomer ratio 65/35] and 5 parts by weight of triphenylsulfonium triflate) was formed by spin coating on a wafer substrate with a 5000 Å-thick oxide film formed on a fabricated gate, and the coating was then prebaked on a hot plate at 130° C. for 100 sec. Thereafter, Composition No. 3 specified in Table 2 was spin-coated on the resist to form a 0.10 μm-thick coating which was then prebaked on a hot plate at 130° C. for 100 sec. Hole (via hole) patterning was carried out by electron beam irradiation under conditions of accelerated voltage 30 kV and electron beam exposure 8 μC/cm$^2$. After the completion of the exposure, post exposure baking (PEB) was carried out on a hot plate at 95° C. for 100 sec with the time from the exposure to PEB being varied in the range of 1 min to 30 min.

Thereafter, the resist was developed with a 2.38% aqueous solution of tetramethylammonium hydroxide for 2 min using a spin developer. The conductive film could be peeled off simultaneously with the development. Thereafter, rinsing with pure water was carried out. A resist pattern was formed in the same manner as described above, except that the above composition was not coated on the resist. The resist pattern thus obtained was compared with the resist pattern which had been prepared above by the process involving the step of coating the composition.

Evaluation of stability against post exposure delay (PED)

A 0.5 μm hole pattern was observed for the resists thus obtained. As a result, it was found that when the composition was not coated on the resist, the hole pattern size for a sample with the time from the exposure to the PEE being 5 min was 25% less than that for a sample with the time from the exposure to the PEB being 1 min. When the time from the exposure to the PEB was 30 min, the surface could not be dissolved in the developing solution, making it impossible to form a pattern.

By contrast, when the composition was coated on the resist, the size variation of the hole pattern was within 5% even in the case of a time from the exposure to the PEB of 30 min, demonstrating that the resist was stable against the post exposure delay (PED). Further, it was confirmed that the use of the composition had no influence on the sensitivity and resolution of the resist.

Evaluation of misregistration derived from charge-up phenomenon

The registration between the 0.5 μm hole pattern of the resist and the gate, having a difference in level, in the underlying substrate was examined. As a result, it was found that when the composition was not coated on the resist, a misregistration up to 0.15 μm occurred due to a charge-up phenomenon.

By contrast, when the composition was coated on the resist, the misregistration was up to 0.05 μm, demonstrating that the composition had the effect of preventing misregistration caused by a charge-up phenomenon.

Comparative Example 1
Pattern formation using material described in prior art document (Japanese Unexamined Patent Publication (Kokai) No. 4-32848)

A resist pattern was formed in the same manner as in Example 1, except that Composition No. 8 (a composition prepared by dissolving 3 parts by weight of sulfonated polyaniline, synthesized by a method described in J. Am. Chem. Soc., 1991, 113, 2665, and 0.1 part by weight of ammonia in 100 parts by weight of water), specified in Table 2, was used.

As a result, a large amount of residues occurred on the resist pattern, resulting in resolution failure.

Further, the misregistration was up to 0.12 μm, demonstrating that the effect of preventing the charge-up phenomenon was also unsatisfactory.

Example 2
(Pattern formation wherein polymer composition is coated on negative-working chemical amplification resist)

A 2.0 μm-thick negative-working chemical amplification resist SAL-601 (manufactured by Sprey) was spin-coated on an Si wafer substrate to form a resist film. The resist film was prebaked on a hot plate at 115° C. for 100 sec. Thereafter, Composition No. 1 specified in Table 2 was spin-coated to a thickness of 0.05 μm, and the coating was prebaked on a hot plate at 80° C. for 100 sec.

Then, patterning for 2.0 μm lines and spaces was formed on the whole chip surface by electron beam irradiation under conditions of accelerated voltage 30 kV and electron beam exposure 15 μC/cm$^2$ by scanning electron beam. After the completion of the exposure, PEB was carried out on a hot plate at 95° C. for 100 sec.

Thereafter, the resist was developed with a 2.38% aqueous solution of tetramethylammonium hydroxide for 5 min using a spin developer. The conductive film could be peeled off simultaneously with the development. Thereafter, rinsing with pure water was carried out. A resist pattern was formed in the same manner as described above, except that the above composition was not coated on the resist. The resist pattern thus obtained was compared with the resist pattern which had been prepared above by the process involving the step of coating the composition.

Evaluation of misregistration derived from charqe-up phenomenon

For the resist pattern thus obtained, the misregistration at a position where fields were connected was observed. As a result, it was found that, when the composition was not coated on the resist, a misregistration of 0.2 μm occurred between fields.

By contrast, when the composition was coated on the resist, the misregistration between fields was not more than 0.04 μm, demonstrating that the composition had the effect of preventing the charge-up phenomenon.

Further, it was confirmed that the use of the composition did not adversely affect the sensitivity and resolution of the resist.

Example 3
(Pattern formation wherein polymer composition is coated on positive-working chemical amplification resist)

Figure 6A:
FIGS. 6A to 6E are flow diagrams showing the formation of a pattern after coating a conductive film on a resist.
Figure 6B:
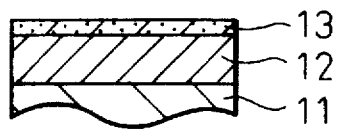
Figure 6C:
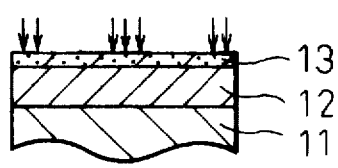
Figure 6D:
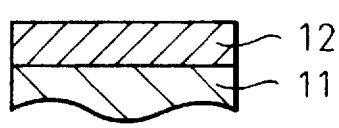
Figure 6E:
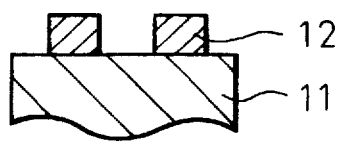

Referring to FIGS. 6A to 6E, a 2.0 μm-thick CMR positive-working resist film 12 (T. Kitakohji, Y. Yoneda, and K. Kitamura, J. Electrochem. Soc., 1979, 126 (11), 1881) was coated on a substrate 11 as described in Example 1 and prebaked on a hot plate at 180° C. for 100 sec (FIG. 6A). Thereafter, Composition No. 4 specified in Table 2, 13, was spin-coated on the CMR resist to a thickness of 0.05 μm, and the coating was prebaked on a hot plate at 100° C. for 100 sec (FIG. 6B). Then, electron beam irradiation was carried out under conditions of accelerated voltage 30 kV and electron beam exposure 50 μC/cm$^2$ (FIG. 6C). Thereafter, the conductive film was peeled off with ethanol using a spin developer (FIG. 6D), and the resist was developed with a 1:1 mixed solution of methyl isobutyl ketone (MIBK) and IPA and rinsed with IPA (FIG. 6E).

The effect of preventing a charge-up phenomenon was investigated in the same manner as in Example 1. As a result, the effect of preventing the misregistration was confirmed.

Example 4
(Pattern formation wherein polymer composition is coated on an upper layer in two-layer resist)

Figure 7A:
FIGS. 7A to 7G are flow diagrams showing the formation of a pattern after coating a conductive film on a two-layer resist.
Figure 7B:
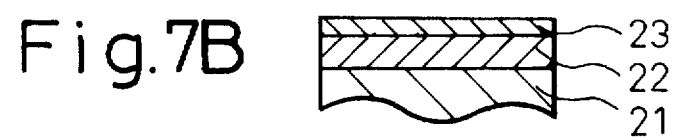
Figure 7C:

An OFPR 800 photoresist (manufactured by Tokyo Ohka Kogyo Co., Ltd.) was spin-coated on an Si wafer substrate 21 to a thickness of 1.0 μm to form a flattening layer (lower layer) 22 and hard-baked at 200° C. for 5 min (FIG. 7A). A silicone resist Z-SEN (manufactured by Nippon Zeon Co., Ltd.) was spin-coated thereon to a thickness of 0.2 μm to form a resist layer 23 which was then prebaked at 80° C. for 90 sec (FIG. 7B). Composition No. 2 specified in Table 2 was spin-coated thereon to a thickness of 0.15 μm to form a conductive film 24 which was then prebaked at 100° C. for 100 sec (FIG. 7C).

Figure 7D:
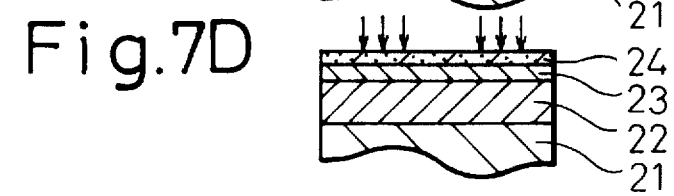
Figure 7E:
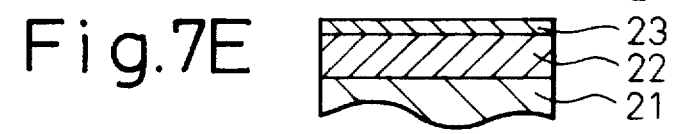
Figure 7F:
Figure 7G:
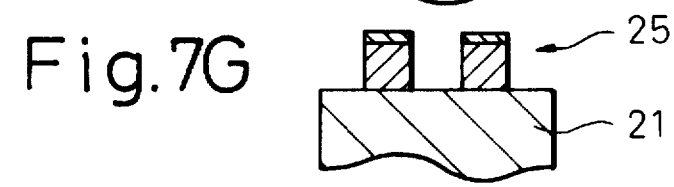

Thereafter, electron beam irradiation was carried out under conditions of accelerated voltage 30 kV and electron beam exposure 20 μC/cm$^2$ (FIG. 7D), and the conductive film was peeled off with pure water using a spin developer (FIG. 7E). The resist Z-SEN was then rinsed with IPA, developed with MIBK, and rinsed with IPA to form an upper resist pattern 23' (FIG. 7F). After-baking was carried out at 80° C. for 90 sec, and the upper resist pattern 23' was transferred to the lower layer 22 using a plane parallel plate type reactive ion etching apparatus under conditions of oxygen gas pressure 2.6 Pa, applied frequency 13.56 MHz, oxygen gas flow rate 20 sccm, and applied power density 0.16 W/cm$^2$, thereby preparing a multilayer resist pattern 25.

The effect of preventing a charge-up phenomenon was investigated in the same manner as in Example 2. As a result, it was found that the composition had the effect of preventing the misregistration of a pattern.

Example 5
(Pattern formation wherein polymer composition is coated on upper layer in three-layer resist)

An OFPR 800 photoresist (manufactured by Tokyo Ohka Kogyo Co., Ltd.) was spin-coated on an Si wafer substrate 31 to a thickness of 1.0 μm to form a flattening layer (lower layer) 32 and hard-baked at 200° C. for 5 min (FIG. 8A). A silicone resin OCD type 7 (manufactured by Tokyo Ohka Kogyo Co., Ltd.) was spin-coated thereon to a thickness of 0.2 μm to form an intermediate layer 33 in a three-layer resist. The intermediate layer 33 was then hard-baked at 200° C. for 5 min (FIG. 8B). A CMS resist (manufactured by Tosoh Corporation) was spin-coated thereon to a thickness of 0.5 μm to form a resist film 34 which was then prebaked at 80° C. for 90 sec (FIG. 8C). Further, Composition No. 5 specified in Table 2 was spin-coated to a thickness of 0.15 μm to form a conductive film 35 which was then prebaked at 100° C. for 100 sec (FIG. 8D).

Thereafter, electron beam irradiation was carried out under conditions of accelerated voltage 30 kV and electron beam exposure 35 μC/cm$^2$ (FIG. 8E), and the conductive film was peeled off with a 0.1N aqueous ammonium-methanol solution using a spin developer (FIG. 8F). The resist CMS was then rinsed with IPA, developed with a 1:1 mixed solution of n-butyl ether and ethyl cellosolve, and rinsed with IPA to form an upper resist pattern 34' (FIG. 8G). After-baking was carried out at 80° C. for 90 sec, and the upper resist pattern 34' was transferred onto the intermediate layer using a plane parallel plate type reactive ion etching apparatus under conditions of gas pressure 2.6 Pa, applied frequency 13.56 MHz, $CF_4$ gas flow rate 20 sccm, and applied power density 0.22 W/cm$^2$ (FIG. 8H). Further, the intermediate layer pattern 33' was transferred onto the lower layer 32 using a plane parallel plate type reactive ion etching apparatus under conditions of oxygen gas pressure 2.6 Pa, applied frequency 13.56 MHz, oxygen gas flow rate 20 sccm, and applied power density 0.16 W/cm$^2$, thereby preparing a multilayer resist pattern 36 (FIG. 8I).

The effect of preventing a charge-up phenomenon was investigated in the same manner as in Example 2. As a result, it was found that the composition had the effect of preventing the misregistration of a pattern.

Example 6
(Pattern formation wherein polymer composition is coated between upper and lower resists in two-layer resist)

An OFPR 800 photoresist (manufactured by Tokyo Ohka Kogyo Co., Ltd.) was spin-coated on a silicon substrate 41 to a thickness of 1.0 μgm to form a first resist film 42 which was then hard-baked at 200° C. for 5 min (FIG. 9A). Composition No. 7 specified in Table 2 was spin-coated thereon to a thickness of 0.15 μm to form a conductive film 43 which was then prebaked at 200° C. for 10 min (FIG. 9B). A silicone resist Z-SEN (manufactured by Nippon Zeon Co., Ltd.) was spin-coated thereon to a thickness of 0.2 μm to form a second resist film 44 which was then prebaked at 80° C. for 90 sec (FIG. 9C).

Thereafter, electron beam irradiation was carried out under conditions of accelerated voltage 30 kV and electron beam exposure 20 μC/cm$^2$ (FIG. 9D), and the resist Z-SEN was then developed with MIBK using a spin developer, and rinsed with IPA to form an upper regist pattern 44'. Baking was carried out at 80° C. for 90 sec, and the upper resist pattern 44' was transferred to the lower layer (conductive film and OFPR 800 photoresist film) using a plane parallel plate type reactive ion etching apparatus under conditions of oxygen gas pressure 2.6 Pa, applied frequency 13.56 MHz, oxygen gas flow rate 20 sccm, and applied power density 0.16 W/cm$^2$, thereby preparing a multilayer resist pattern 45.

The effect of preventing a charge-up phenomenon was investigated in the same manner as in Example 1. As a result, it was found that the composition had the effect of preventing the misregistration of a pattern.

Example 7
(Pattern formation wherein polymer composition is coated lower resists in two-layer resist)

Figure 10A:
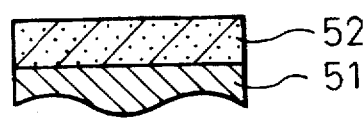
FIGS. 10A to 10E are flow diagrams showing the formation of a pattern using a conductive film as a flattening layer in a two-layer resist.
Figure 10B:
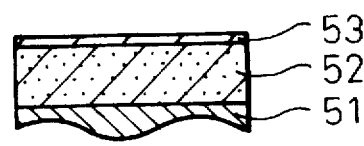

A photoresist having a composition similar to Composition No. 7 in Table 2 but the weight ratio of water being changed from 100 to 20 parts by weight was spin-coated on a silicon substrate 51 to a thickness of 1.0 μm to form a first resist film 52 which was then hard-baked at 200° C. for 5 min (FIG. 10A). A silicone resist Z-SEN (manufactured by Nippon Zeon Co., Ltd.) was spin-coated thereon to a thickness of 0.2 μm to form a second resist film 53 which was then prebaked at 80° C. for 90 sec (FIG. 10B).

Figure 10C:
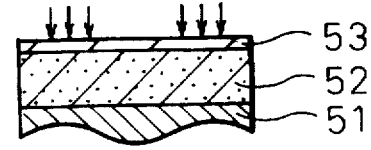
Figure 10D:
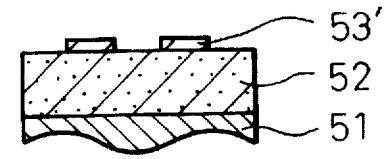
Figure 10E:
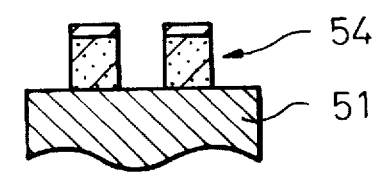
Figure 11A:
FIGS. 11A to 11D are flow diagrams showing the formation of a pattern after coating a conductive film on a resist of a mask substrate.
Figure 11B:
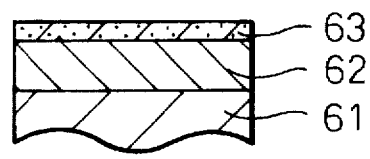
Figure 11C:
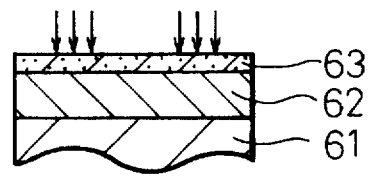
Figure 11D:
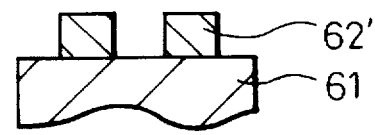
Figure 12A:
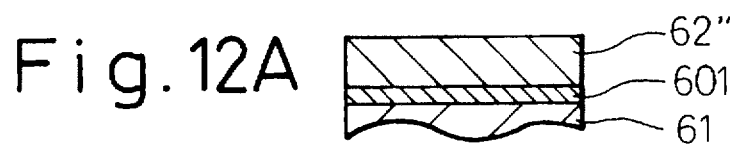
FIGS. 12A to 12D are flow diagrams showing the formation of a pattern after coating a conductive film on a resist of a mask subsrate.
Figure 12B:
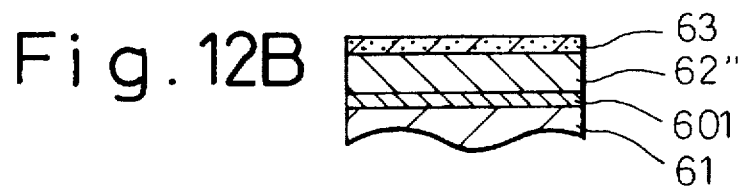
Figure 12C:
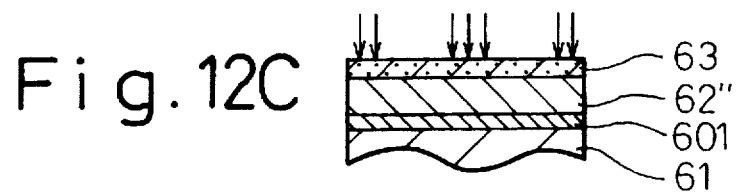
Figure 12D:
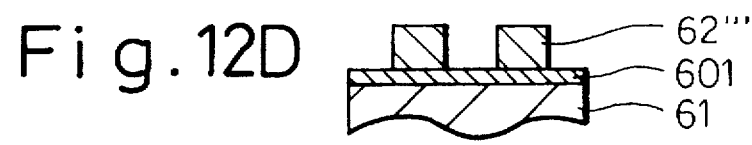

Thereafter, electron beam irradiation was carried out under conditions of accelerated voltage 30 kV and electron beam exposure 20 μC/cm$^2$ (FIG. 10C), and the resist Z-SEN was then developed with MIBK using a spin developer, and rinsed with IPA to form an upper regist pattern 53'. Baking was carried out at 80° C. for 90 sec, and the upper resist pattern was transferred to the lower layer (conductive film using a plane parallel plate type reactive ion etching apparatus under conditions of oxygen gas pressure 2.6 Pa, applied frequency 13.56 MHz, oxygen gas flow rate 20 sccm, and applied power density 0.16 W/cm$^2$, thereby preparing a multilayer resist pattern 54.

The effect of preventing a charge-up phenomenon was investigated in the same manner as in Example 1. As a result, it was found that the composition had the effect of preventing the misregistration of a pattern.

Example 8
(Patterning on mask substrate) (see FIGS. 11A to 11D)

A 0.5 μm-thick chemical amplification SAL negative resist was spin-coated on a mask substrate to form a resist film 62 which was then prebaked on a hot plate at 110° C. for 100 sec. Thereafter, Composition No. 6 specified in Table 2 was spin-coated on the resist 62 to form a 0.05 μm-thick coating 63 which was then prebaked on a hot plate at 80° C. for 100 sec. Patterning was then carried out by electron beam irradiation under conditions of accelerated voltage 20 kV and electron beam exposure 10 μC/cm$^2$. After the completion of the exposure, baking was carried out on a hot plate at 105° C. for 8 min.

Thereafter, the resist was developed with a 2.38 wt% aqueous solution of tetramethylammonium hydroxide for 5 min using a spin developer. The conductive film could be peeled off simultaneously with the development. Thereafter, rinsing with pure water was carried out.

The effect of preventing a charge-up phenomenon was investigated in the same manner as in Example 2. As a result, it was found that the composition had the effect of preventing the misregistration of a pattern.

Example 9
(Patterning on halftone mask substrate) (see FIGS. 12A to 12D)

A 100 Å-thick chromium oxide 601 was formed on a quartz substrate 61 to prepare a halftone mask substrate. A chemical amplification positive resist (having the same composition as the resist used in Example 1) was spincoated on the mask substrate to a thickness of 0.4 μm to form a resist film 62" which was then prebaked on a hot plate at 110° C. for 100 sec.

Thereafter, Composition No. 1 specified in Table 2 was spin-coated on the resist 62" to form a 0.05 μm-thick coating 63 which was then prebaked on a hot plate at 110° C. for 100 sec.

Patterning was then carried out by electron beam irradiation under conditions of accelerated voltage 20 kV and electron beam exposure 10 μC/cm$^2$. After the completion of the exposure, baking was carried out on a hot plate at 95° C. for 8 min.

Thereafter, the resist was developed with a 2.38 wt% aqueous solution of tetramethylammonium hydroxide using a spin developer. The conductive film 63 could be peeled off simultaneously with the development. The resist 62" was developed for 2 min by a dipping process and then rinsed with pure water.

The effect of preventing a charge-up phenomenon was investigated in the same manner as in Example 2. As a result, it was found that the composition had the effect of preventing the misregistration of a pattern.

Example 10
(Application to ion implantation process)

This example demonstrates the application of Composition No. 3, specified in Table 2, as an antistatic process in channeled doping (ion implantation) of an rNOS Si gate process (see FIGS. 13A to 13E).

Figure 13A:
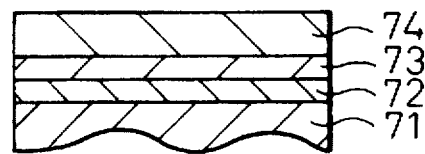
FIGS. 13A to 13E are flow diagrams showing the use of a conductive film in channel doping (ion implantation) of an NMOS Si gate.

An oxide film 72 (500 Å) for LOCOS is formed on a p type Si substrate 71, and a nitride film 73 (1500 Å) was formed thereon. A photoresist for patterning was coated on the substrate to a thickness of 1.5 μm to form a resist film 74 which was then prebaked (FIG. 13A).

Figure 13B:
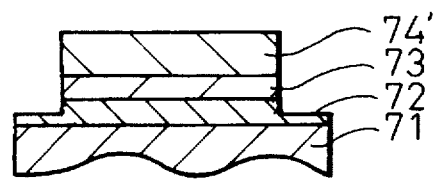

The resist was patterned at its portion where a transistor was formed, thereby forming a resist pattern 74'. Then, the nitride film was etched (FIG. 13B).

Figure 13C:
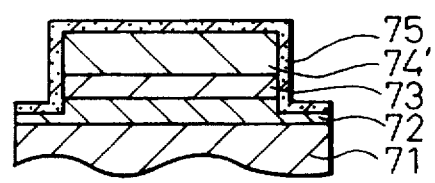

The conductive composition was spin-coated on the substrate to form a 0.08 μm-thick conductive film 75 which was then baked at 80° C. (FIG. 13C).

Figure 13D:
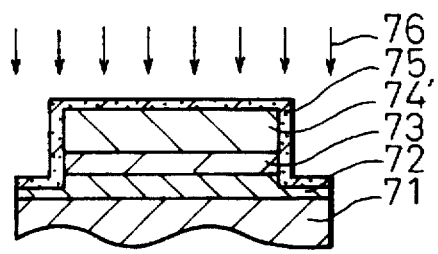

In order to form a channel stopper, $B^+$ 76 was implanted (80 Kev, $1\times10^{14}$ ion/cm$^2$) (FIG. 13D).

Figure 13E:
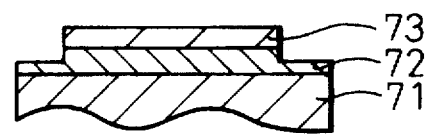

The resist was peeled off by a wet process (FIG. 13E). At the same time, the conductive film was also, in many cases, peeled off by this wet process. If necessary, it is possible to provide the step of previously peeling the conductive film. For example, the conductive film may be peeled off by dropping pure water thereon for 30 sec.

Example 11
(Application to ion implantation process: for formation of source drain N channel)

This example demonstrates the application of Composition No. 2, specified in Table 2, as an antistatic process in ion implantation for the formation of a source and a drain in an MOS Si gate process (FIGS. 14A to 14E).

Figure 14A:
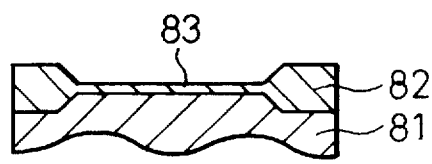
FIGS. 14A to 14E are flow diagrams showing the use of a conductive film in ion implantation for the formation of a source and a drain in an MOS Si gate process.

A field oxide film 82 (film thickness 5000 Å) and a gate oxide film 83 (film thickness 500 Å) were formed on a substrate 81, and $B^+$ is implanted (FIG. 14A).

Figure 14B:
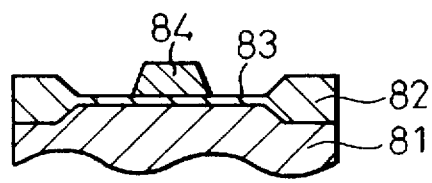

Then, polycrystalline Si was deposited, diffused, and patterned to form a gate (1500 Å) 84 pattern of polycrystalline Si (FIG. 14B).

In order to form source and drain regions, $As^+$ was implanted using the gate as a mask. In this step, the antistatic process was applied.

Figure 14C:
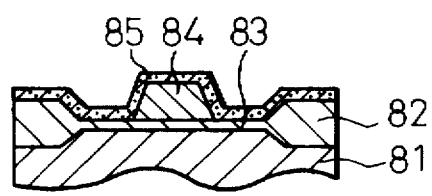

The conductive composition was coated on the substrate to a thickness of 0.1 μm to form a conductive film 85 which was then baked at 80° C. for 100 sec (FIG. 14C).

Figure 14D:
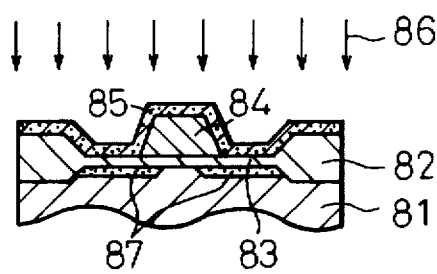

$As^+$ 86 was implanted ($5\times10^{14}$ ion/cm$^2$, 50 Kev) (FIG. 14D). In the drawing, numeral 87 designates source and drain regions in which $As^+$ has been implanted.

Figure 14E:
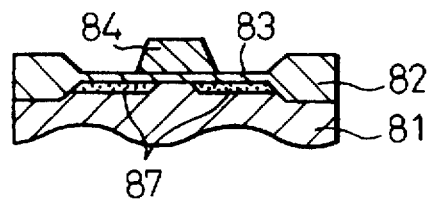

Subsequently, the conductive film was peeled off by dropping pure water thereon for 60 sec (FIG. 14E).

Example 12
(Application to ion implantation process: for formation of source drain P channel)

This example demonstrates the application of Composition No. 4, specified in Table 2, as an antistatic process in ion implantation for the formation of a source and a drain (P channel) in CMOS logic.

Si, possessing crystal orientation (100) and having a resistance of 10 Ω, bearing a 150 Å-thick oxide film, was provided as a substrate.

A mask pattern for II (ion implantation) for the formation of a source and a drain was formed in a resist film to a thickness of 1.0 μm.

The conductive composition was coated on the substrate bearing a patterned resist to form a 0.1 μm-thick coating which was then baked at 100° C. for 80 sec.

Subsequently, in order to form source and drain regions, $B^+$ was implanted ($5\times10^{15}$ ion/cm$^2$, 15 Kev).

Example 13

A 1.5 μm-thick negative-working chemical amplification resist SAL-601 (manufactured by Sprey) was spin-coated on an Si wafer substrate to form a resist film which was then prebaked on a hot plate at 120° C. for 120 sec. Thereafter, Composition No. 1 specified in Table 2 was spin-coated on the resist to a thickness of 0.05 μm, and the coating was prebaked on a hot plate at 80° C. for 120 sec. Then, patterning for 1.0 μm lines and spaces was formed by electron beam irradiation under conditions of accelerated voltage 30 kV and electron beam exposure 20 μC/cm$^2$ by scanning the electron beam. After the completion of the exposure, PEB was carried out on a hot plate at 100° C. for 100 sec.

Thereafter, the resist was developed with a 2.38% aqueous solution of tetramethylammonium hydroxide for 10 min using a spin developer. The coating film on the resist could be peeled off simultaneously with the development. Thereafter, rinsing with pure water was carried out. As a result, it was confirmed that 1.0 μm lines and spaces could be resolved.

Comparative Example 2

Coating of a composition on a resist was carried out in the same manner as in Example 12, except that a composition was prepared according to the formulation of a composition of a working example described in Japanese Unexamined Patent Publication (Kokai) No. 4-32848 (a method described on page 7 of the publication document (Polymer Preprints of the 39th Meeting of The Society of Polymer Science, Japan, Vol. 39, 561 (1990)), that is, by synthesizing a polymer compound (Ia) and dissolving 1 part by weight of the polymer in 100 parts by weight of water and was used, instead of Composition No. 1 specified in Table 2, to form a coating on the resist. The coating was subjected to electron beam exposure, PEB, development, and rinsing in the same manner as in Example 12. As a result, crosslinking occurred in the whole resist, and a pattern was not formed at all.

Example 14

A novolak photoresist was spin-coated on an Si wafer to a thickness of 2.0 μm to form a resist film which was then hard-baked on a hot plate at 250° C. for 300 sec. Thereafter, OCD (a silicone resin manufactured by Tokyo Ohka Kogyo Co., Ltd.) was spin-coated to form a 0.1 μm-thick intermediate layer which was then hard-baked at 250° C. for 300 sec. A negative-working chemical amplification resist SAL-601 (manufactured by Sprey) was coated thereon to a 0.3 μm-thick coating which was then prebaked at 100° C. for 120 sec. Further, Composition No. 1 specified in Table 2 was spin-coated on the resist to a thickness of 0.05 μm, and the coating was prebaked at 80° C. for 120 sec.

Then, patterning for 0.5 μm lines and 0.3 μm spaces was conducted by electron beam irradiation under conditions of accelerated voltage 30 kV and electron beam exposure 5 to 10 μC/cm$^2$ by scanning the electron beam. After the completion of the exposure, PEB was carried out on a hot plate at 115° C. for 100 sec.

Thereafter, the resist was developed with a 2.38% aqueous solution of tetramethylammonium hydroxide for 60 sec using a spin developer. The coating film on the resist, by virtue of high solubility, could be peeled off simultaneously with the development. After the development, rinsing with pure water was carried out. As a result, it was confirmed that a pattern of 0.5 μm lines and 0.3 μm spaces could be resolved without leaving any residue.

Comparative Example 3

Coating of a composition on SAL-601 resist was carried out in the same manner as in Example 13, except that a composition described in Example 1 of Japanese Unexamined Patent Publication (Kokai) No. 6-3813 was used instead of Composition No. 1 specified in Table 2. The coating was subjected to electron beam exposure, PEB, development, and rinsing in the same manner as in Example 13. As a result, although a resist pattern could be formed, a large amount of a residue occurred due to low solubility of the composition provided on the resist.

Example 15

An IC circuit (in a chip form) was provided as a measurement sample. Composition No. 1 specified in Table 2 was coated on the substrate to form a 0.05 μm-thick coating which was then dried in an oven at 60° C. for 3 min.

Figure 15:
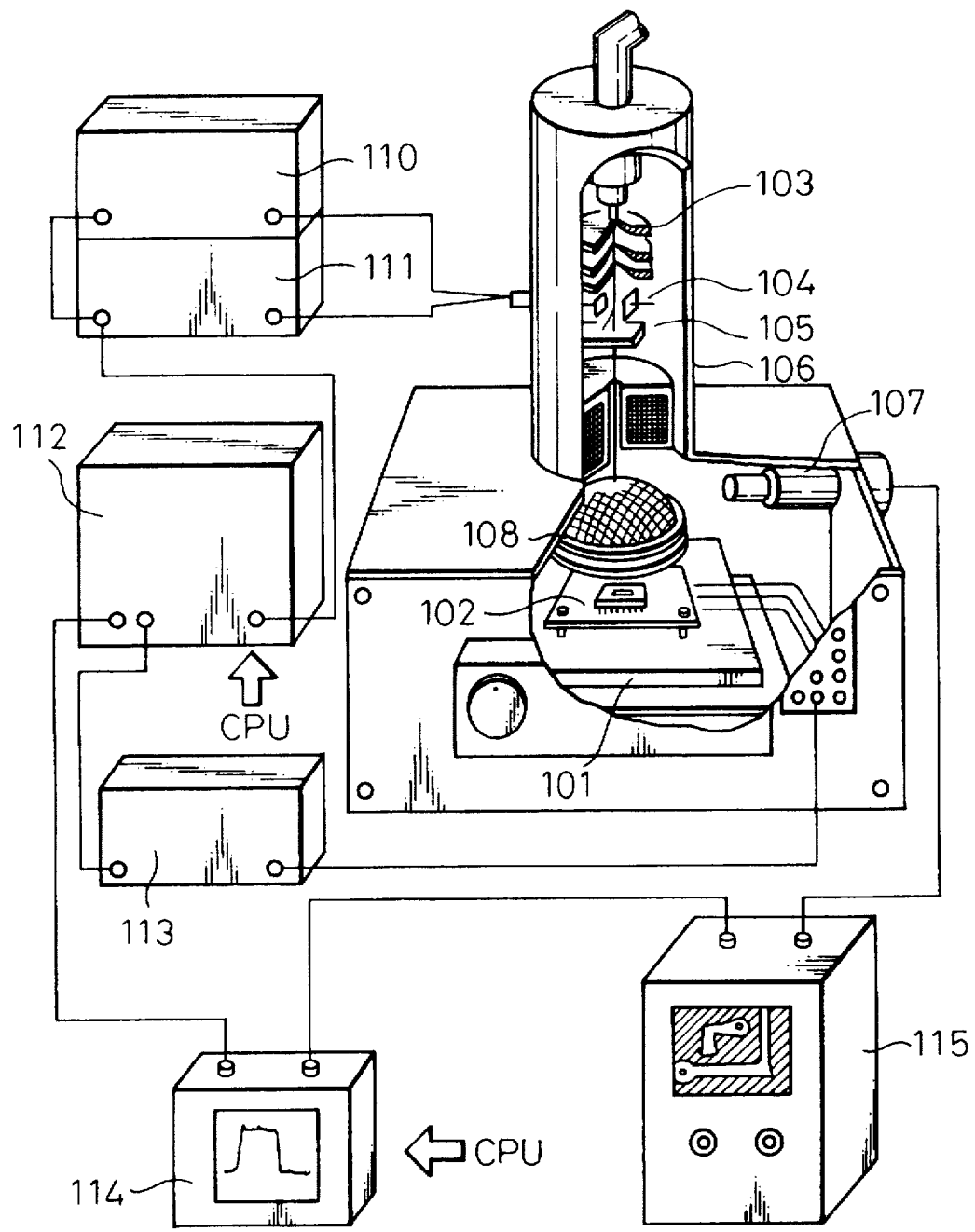
FIG. 15 is an embodiment of the layout of an electron beam tester.

Subsequently, the potential distribution in the LSI was measured using an electron beam tester as shown in FIG. 15 to prepare a potential image. In FIG. 15, numeral 101 designates a sample stage, numeral 102 a sample, numeral 103 a field radiation electron gun, numeral 104 a deflector, numeral 105 a chopping aperture, numeral 106 a magnetic lens, numeral 107 a secondary electron detector, numeral 108 an energy filter, numerals 110 and 111 a pulse oscillator, numeral 112 a phase controller, numeral 113 an LSI drive circuit, numeral 114 a wave form display, and numeral 115 an image display. The measurement could be accurately carried out without influence of electrification.

The sample after the measurement was washed with pure water for 100 sec and dried, and the conductive film was peeled off.

As a result, it was possible to form and peel a conductive film without damaging the sample LSI.

We claim:

1. A method for forming a pattern on an object, which comprises:

coating a composition on a resist film on the object to be coated, said composition comprising 100 parts by weight of a solvent and 0.01 to 30 parts by weight of a soluble aniline polymer comprising at least one of the repeating units:

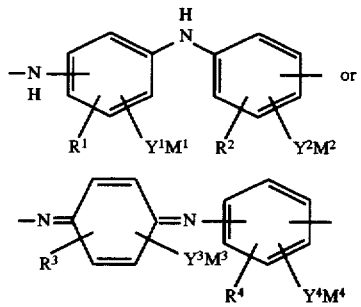

wherein $R^1$, $R^2$, $R^3$ and $R^4$ are each an electron-donating group; $Y^1$, $Y^2$, $Y^3$ and $Y^4$ are each —$SO_3$— or —$COO$—; and $M^1$, $M^2$, $M^3$ and $M^4$ are each a hydrogen ion, an ammonium ion, a $C_1$-$C_8$ alkyl ammonium ion, an aromatic ammonium ion or a quaternary ion of an aromatic heterocyclic ring; wherein, the polymer contains at least 80% of the repeating units, has a weight average molecular weight of not less than 10,000, is soluble in water or a water-containing organic solvent, and is solid at room temperature;

exposing the coated object pattern-wise to ionizing radiation; and dissolving the coating and developing the resist film to form a pattern on the object.

2. A method according to claim 1, wherein the resist film is developed at the same time the coating is being dissolved.

3. The method according to claim 1 or 2, wherein $R^1$, $R^2$, $R^3$ and $R^4$ are independently a $C_1$-$C_8$ alkyl group, a $C_1$-$C_8$ alkoxy group or a halogen.

4. A method according to claim 1 or 2, wherein $R^1$, $R^2$, $R^3$ and $R^4$ are $C_1$-$C_8$ alkoxy groups and $Y^1$, $Y_2$, $Y_3$ and $Y^4$ are —$SO_3$—.

5. A method according to claim 1 or 2, wherein the composition further comprises 0.01 to 15 parts by weight of ammonia, a $C_1$-$C_8$ aliphatic amine, an aromatic amine, a heterocyclic compound or a quaternary salt thereof.

6. A method according to claim 1 or 2, wherein the composition further comprises 0.001 to 30 parts by weight of a compound or a polymer containing an acidic group.

7. A method according to claim 6, wherein the acidic group is a sulfone or a carboxyl group.

8. A method for forming a pattern on an object, which comprises:

coating a composition on a resist film on the object to be coated, said composition comprising 100 parts by weight of a solvent and 0.01 to 30 parts by weight of a soluble aniline polymer comprising at least one of the repeating units:

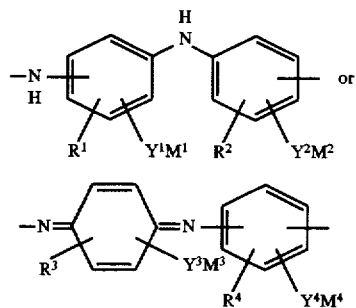

wherein $R^1$, $R^2$, $R^3$ and $R^4$ are each a $C_1$-$C_8$ alkoxy group; $Y^1$, $Y^2$, $Y^3$ and $Y^4$ are each —$SO_3$—; and $M^1$, $M^2$, $M^3$ and $M^4$ are each a hydrogen ion, an ammonium ion, a $C_1$-$C_8$ alkyl ammonium ion, an aromatic ammonium ion or a quaternary ion of an aromatic heterocyclic ring; wherein, the polymer contains 100% of the repeating units, has a weight average molecular weight of not less than 10,000, is soluble in water or a water-containing organic solvent, and is solid at room temperature;

exposing the coated object pattern-wise to ionizing radiation; and dissolving the coating and developing the resist film to form a pattern on the object.

* * * * *